(12) United States Patent
Park et al.

(10) Patent No.: US 11,894,059 B2
(45) Date of Patent: Feb. 6, 2024

(54) APPARATUS AND METHOD FOR PROGRAMMING DATA IN A NON-VOLATILE MEMORY DEVICE

(71) Applicant: SK hynix Inc., Gyeonggi-do (KR)

(72) Inventors: Tae Hun Park, Gyeonggi-do (KR); Dong Hun Kwak, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 174 days.

(21) Appl. No.: 17/547,834

(22) Filed: Dec. 10, 2021

(65) Prior Publication Data
US 2023/0032133 A1    Feb. 2, 2023

(30) Foreign Application Priority Data

Jul. 28, 2021  (KR) .................. 10-2021-0098925
Aug. 4, 2021  (KR) .................. 10-2021-0102602

(51) Int. Cl.
*G11C 16/10* (2006.01)
*G11C 16/04* (2006.01)
*G11C 16/34* (2006.01)
*G06F 3/06* (2006.01)
*G11C 11/56* (2006.01)
*G11C 16/24* (2006.01)

(52) U.S. Cl.
CPC ............ *G11C 16/10* (2013.01); *G06F 3/0604* (2013.01); *G06F 3/0659* (2013.01); *G06F 3/0679* (2013.01); *G11C 11/5628* (2013.01); *G11C 16/0483* (2013.01); *G11C 16/24* (2013.01); *G11C 16/3459* (2013.01)

(58) Field of Classification Search
CPC ...... G11C 16/10; G11C 16/0483; G11C 16/24; G11C 16/3459; G11C 11/5628; G06F 3/0604; G06F 3/0659; G06F 3/0679
See application file for complete search history.

(56) References Cited

U.S. PATENT DOCUMENTS

| 6,044,017 | A  | * | 3/2000 | Lee ................... | G11C 16/0483 |
| | | | | | 365/185.26 |
| 7,561,474 | B2 |   | 7/2009 | Kim et al. | |
| 7,633,803 | B2 | * | 12/2009 | Lee ................... | G11C 16/0483 |
| | | | | | 365/185.21 |
| 8,027,202 | B2 | * | 9/2011 | Lee ................... | G11C 16/3454 |
| | | | | | 365/185.26 |
| 9,330,766 | B1 | * | 5/2016 | Jung .................. | G11C 16/0483 |

(Continued)

FOREIGN PATENT DOCUMENTS

KR   10-2006-0108324 A   10/2006

*Primary Examiner* — Son L Mai
(74) *Attorney, Agent, or Firm* — IP & T GROUP LLP

(57) ABSTRACT

A memory device includes a memory structure including at least one non-volatile memory cell capable of storing multi-bit data, and a control device configured to perform a program verification after a first program pulse is applied to the at least one non-volatile memory cell, determine a program mode for the at least one non-volatile memory cell based on a result of the program verification, and change a level of a pass voltage, applied to another non-volatile memory cell coupled to the at least one non-volatile memory cell, from a first level to a second level which is higher than the first level, or a setup time for changing a potential of a bit line coupled to the at least one non-volatile memory cell, according to the program mode.

20 Claims, 16 Drawing Sheets

(56) References Cited

U.S. PATENT DOCUMENTS

| | | | |
|---|---|---|---|
| 9,412,460 B2* | 8/2016 | Chen | G11C 16/0483 |
| 9,520,198 B2* | 12/2016 | Choi | G11C 16/24 |
| 10,388,381 B2* | 8/2019 | Shin | G11C 16/0483 |
| 10,580,501 B2* | 3/2020 | Watanabe | G11C 16/3459 |
| 10,943,663 B1* | 3/2021 | Wang | G11C 16/12 |
| 10,971,234 B2* | 4/2021 | Lee | G11C 16/08 |
| 2020/0321058 A1 | 10/2020 | Lee et al. | |
| 2022/0415401 A1* | 12/2022 | Park | G11C 16/08 |

* cited by examiner

FIG. 13

|  |  | Temp (℃) | | | |
| --- | --- | --- | --- | --- | --- |
|  |  | -40 | 0 | 40 | 80 |
| OVD Level | 1 | 7.5 | 7.3 | 7.1 | 6.9 |

FIG. 16

| | | Temp (℃) | | | |
|---|---|---|---|---|---|
| | | -40 | 0 | 40 | 80 |
| PGM Loop | 1 | 6 | 5.8 | 5.4 | 5.2 |
| | 2 | 5.8 | 5.6 | 5.2 | 5 |
| | 3 | 5.6 | 5.4 | 5 | 4.9 |
| | 4 | 5.4 | 5.2 | 4.9 | 4.8 |
| | 5 | 5.2 | 5 | 4.8 | 4.6 |
| | 6 | 5 | 4.8 | 4.7 | 4.5 |
| | ... | | | | |
| | ... | | | | |
| | ... | | | | |
| | 20 | 4.5 | 4.3 | 4.1 | 4 |
| | 21 | 4.5 | 4.3 | 4.1 | 4 |

APPARATUS AND METHOD FOR PROGRAMMING DATA IN A NON-VOLATILE MEMORY DEVICE

CROSS-REFERENCE TO RELATED APPLICATIONS

This patent application claims the benefits of Korean Patent Application No. 10-2021-0098925, filed on Jul. 28, 2021, and Korean Patent Application No. 10-2021-0102602, filed on Aug. 4, 2021, the entire disclosures of which are incorporated herein by reference.

TECHNICAL FIELD

Embodiments of the present disclosure described herein relate to a memory device, and particularly, to an apparatus and a method for storing or programming data in a non-volatile memory device.

BACKGROUND

Recently, a paradigm for a computing environment has shifted to ubiquitous computing, which enables computer systems to be accessed virtually anytime and anywhere. As a result, the use of portable electronic devices (e.g., mobile phones, digital cameras, notebook computers, or the like) is rapidly increasing. Such portable electronic devices each may use or include a memory system having at least one memory device. The memory system may be a data storage device. The data storage device can be used as a main storage device or an auxiliary storage device of a portable electronic device.

Unlike a hard disk, such a data storage device uses non-volatile semiconductor memories, exhibits improved stability and durability, has no mechanical driving parts (e.g., a mechanical arm), and thus provides high data access speeds and relatively low power consumption. Examples of the data storage device having such advantages include, but are not limited to, Universal Serial Bus (USB) memory devices, memory cards having various interfaces, solid state drives (SSDs), and so on.

BRIEF DESCRIPTION OF THE DRAWINGS

The description herein makes reference to the accompanying drawings wherein like reference numerals refer to like parts throughout the figures.

FIG. 13 illustrates a table used for determining a level of pass voltage according to an embodiment of the present disclosure.

FIG. 16 illustrates an example of a correlation between bit line setup time and program loop and an operating environment.

DETAILED DESCRIPTION

Figure 1:
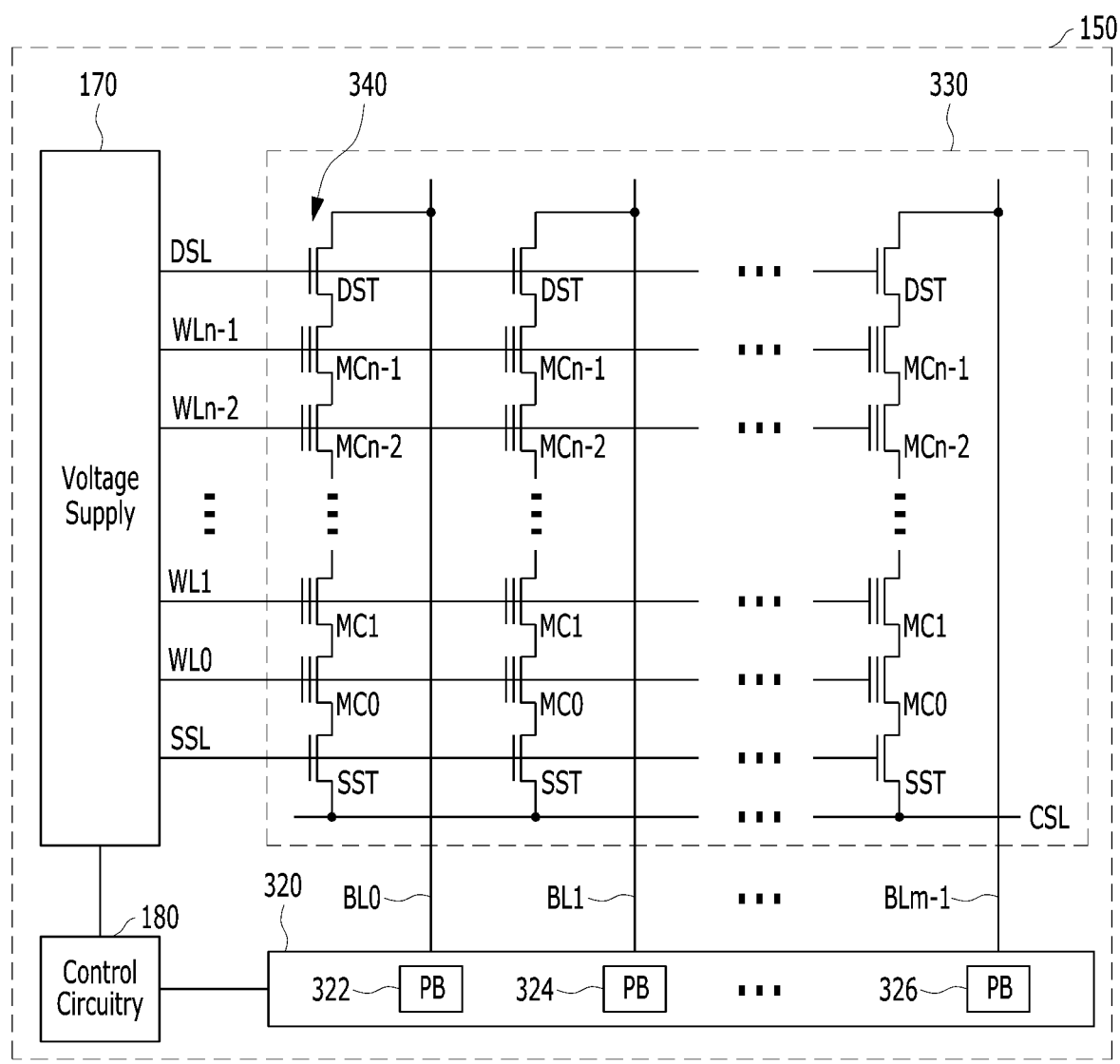
FIG. 1 illustrates a memory device according to an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language include hardware, for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

An embodiment of the present disclosure can provide a data processing system and a method for operating the data processing system. The data processing system includes components and resources such as a memory system and a host, and is capable of dynamically allocating plural data paths used for data communication between the components based on usages of the components and the resources.

An embodiment of the present disclosure can provide an apparatus and a method for improving data input/output speed of a memory device included in the data processing system. Further, according to an embodiment of the present disclosure, the data input/output speed can be improved in a process of programming a data item in a non-volatile memory device.

In an embodiment, a memory device can include a memory structure including at least one non-volatile memory cell capable of storing multi-bit data; and a control device configured to perform a program verification after a first program pulse is applied to the at least one non-volatile memory cell, determine a program mode for the at least one non-volatile memory cell based on a result of the program verification, and change a level of a pass voltage, which is applied to another non-volatile memory cell coupled to the at least one non-volatile memory cell, from a first level to a second level which is higher than the first level or a setup time for changing a potential of a bit line coupled to the at least one non-volatile memory cell, according to the program mode. Herein, the performing the program verification, the determining the program mode and the changing the level of the pass voltage are performed during a data program operation of applying a plurality of program pulses to program multi-bit data to the at least one non-volatile memory cell The memory structure can include a first transistor, coupled between the at least one memory cell and a bit line, and configured to operate in response to the first control voltage applied to the drain select line (DSL); a second transistor, coupled between the at least one memory cell and a source line, and configured to operate in response to a second control voltage applied to a string select line (SSL); and the at least one non-volatile memory cell, coupled between the first transistor and the second transistor, and configured to store the multi-bit data through the plurality of program pulses.

The at least one non-volatile memory cell can include N number of transistors serially connected to each other between the first transistor and the second transistor. The control device can program the multi-bit data to the at least one non-volatile memory cell in an order from a transistor connected to the first transistor to another transistor connected to the second transistor, among the N number of transistors.

The control device can be further configured to determine the level of the pass voltage in response to a temperature of the memory device. The control device can change the level of the pass voltage from the first to the second level by performing overvoltage driving.

The control device is further configured to maintain second level can until a potential of a bit line coupled to the at least one non-volatile memory cell is changed according to the program mode determined based on the result of the program verification.

The control device can be further configured to apply the pass voltage having the first level to at least one other non-volatile memory cell which is in an erased state and apply the pass voltage having the second level to at least one other non-volatile memory cell which has been programmed.

The control device can be further configured to increase the level of the pass voltage in response to a number of program pulses applied to the at least one non-volatile memory cell during the data program operation. The setup time can become shorter as a temperature of the memory device is higher.

The control device can determine the program mode corresponding to a second program pulse as one selected from a first mode, a second mode, and a third mode. The control device is further configured to apply, in the first mode, the second program pulse to the at least one non-volatile memory cell for changing or adjusting a threshold voltage of the at least one non-volatile memory cell by a first amount which is equal to, or larger than, that an amount caused by the first program pulse. The control device is further configured to apply, in the second mode, the second program pulse to change or adjust the threshold voltage of the at least one non-volatile memory cell by a second amount which is smaller than the amount caused by the first program pulse. The control device is further configured to apply, in the third mode, the second program pulse to the at least one non-volatile memory cell of which a change of the threshold voltage is inhibited.

The control device can change the level of the pass voltage when the program mode is the second mode. The control device can determine the setup time corresponding to each of the first mode, the second mode, and the third mode.

The setup time can become shorter as a number of program pulses applied to the at least one non-volatile memory cell during the data program operation is greater.

In an embodiment, a memory system can include a memory device comprising plural non-volatile memory cells; and a controller configured to receive a write command and write data from a host, determine a location in which the write data is stored in the memory device, and transfer the write data to the memory device. The memory device can be configured to determine a program mode which causes a change of threshold voltages of the plural non-volatile memory cells, and change a level of a pass voltage, which is applied to other non-volatile memory cells coupled to the plural non-volatile memory cells, from a first level to a second level which is higher than the first level or a setup time for changing a potential of a bit line coupled to the at least one non-volatile memory cell, according to the program mode. Herein, the determining and the changing are performed during a data program operation of applying a plurality of program pulses to program the write data to the plural non-volatile memory cells.

The plural non-volatile memory cells in the memory device can be coupled to each other via a single word line. Each of the plural non-volatile memory cells can be coupled to a different bit line. The memory device can include a string including a first transistor configured to operate in response to the first control voltage applied to a drain select line (DSL), a second transistor configured to operate in response to a first control voltage applied to a string select line (SSL), a non-volatile memory cell among the plural non-volatile memory cell, and the other non-volatile memory cells coupled serially to the non-volatile memory cell between the first transistor and the second transistor.

The memory device can program multi-bit data in the string in an order from a memory cell connected to the first transistor to another memory cell connected to the second transistor of the string.

The memory device can be further configured to apply the pass voltage having the first level to at least one non-volatile memory cell in an erased state between the second transistor and the one of the plural non-volatile memory cells and apply the pass voltage having the second level to at least one non-volatile memory cell which has been programmed between the first transistor and the one of the plural non-volatile memory cells.

The memory device can be further configured to determine the level of the pass voltage in response to a temperature of the memory device. The memory device can change the first level to the second level by performing overvoltage driving.

The memory device can be further configured to maintain the second level until a potential of a bit line coupled to the one of the plural non-volatile memory cells is changed according to the program mode determined based on the result of the program verification.

The memory device can be further configured to apply the pass voltage having the first level to at least one another non-volatile memory cell which is in an erased state and apply the pass voltage having the second level to at least one another non-volatile memory cell which has been programmed.

The memory device can be further configured to increase the level of the pass voltage in response to a number of program pulses applied to the one of the plural non-volatile memory cells during the data program operation. The setup time can become shorter as a temperature of the memory device is higher.

The program mode corresponding to the second program pulse can be determined as one selected from a first mode, a second mode, and a third mode. The first mode is for applying the second program pulse to change or adjust a threshold voltage of the non-volatile memory cell by a first level which is equal to, or larger than, that caused by the first program pulse. The second mode is for applying the second program pulse to change or adjust the threshold voltage of the non-volatile memory cell by a second level which is smaller than that caused by the first program pulse. The third mode is for applying the second program pulse to the non-volatile memory cell of which a change of the threshold voltage is inhibited.

The memory device can change the level of the pass voltage when the program mode is the second mode. The control device can determine the setup time corresponding to each of the first mode, the second mode, and the third mode.

The setup time becomes shorter as a number of program pulses applied to the at least one non-volatile memory cell during the data program operation is greater.

In another embodiment, a method for operating a memory device can include applying a first program pulse through a word line to program multi-bit data to plural non-volatile memory cells; verifying program states of the plural non-volatile memory cells which corresponds to the first program pulse; determining a program mode, which causes a change of threshold voltages of the plural non-volatile memory cells, for a second program pulse to be applied to the word line; applying a level of a pass voltage, which is applied to other non-volatile memory cells coupled to the plural non-volatile memory cells, from a first level to a second level which is higher than the first level, before controlling a potential of a bit line according to the program mode while the second program pulse is applied to the word line, or adjusting a setup time for changing a potential of a bit line coupled to the at least one non-volatile memory cell, according to the program mode.

In another embodiment, an operating method of a non-volatile memory device having a string of memory cells coupled to a bit line, the operating method can include performing a program operation sequentially on the memory cells according to an incremental step pulse programming (ISPP) scheme. The performing can include applying a program pulse to a selected cell of the string while applying a first pass voltage to an unselected and erased cell of the string and a second pass voltage to an unselected and programmed cell of the string. The second pass voltage can stay higher than the first pass voltage for a predetermine amount of time for discharging, before adjusting a potential of the bit line, a channel of the string by turning on a drain select transistor coupled to the bit line.

Embodiments of the present disclosure will now be described with reference to the accompanying drawings, wherein like numbers reference like elements.

FIG. 1 illustrates a memory system according to an embodiment of the present disclosure. Specifically, FIG. 1 schematically illustrates a memory cell array circuit of a memory die included in a memory device according to an embodiment of the present disclosure.

Referring to FIG. 1, a memory die can include a memory group 330 including a plurality of non-volatile memory cells. The memory group 330 can include a plurality of cell strings 340. The cell string 340 includes plural non-volatile memory cells connected to each of plural bit lines BL0 to BLm−1. The cell string 340 disposed in each column of the memory group 330 can include at least one drain select transistor DST and at least one source select transistor SST. A plurality of non-volatile memory cells or memory cell transistors MC0 to MCn−1 may be connected in series between the drain and source select transistors DST, SST. For example, each of the non-volatile memory cells MC0 to MCn−1 may be configured as a multi-level cell (MLC) that stores a data item having plural bits per cell. The cell strings 340 may be electrically connected to the corresponding bit lines BL0 to BLm−1, individually.

FIG. 1 shows the memory group 330 including NAND-type flash memory cells as an example. However, the memory group 330 included in a memory device 150 according to an embodiment of the present disclosure may not be limited to the NAND-type flash memory. In another embodiment, the memory group 330 can also be implemented as a NOR-type flash memory, a hybrid flash memory in which at least two different types of memory cells are mixed or combined, or a one-chip NAND flash memory in which a controller is embedded in a single memory chip. In addition, the memory group 330 according to an embodiment of the present disclosure can include a flash memory cell in which a charge trap flash (CTF) layer including a conductive floating gate or insulating layer is included.

Figure 2:
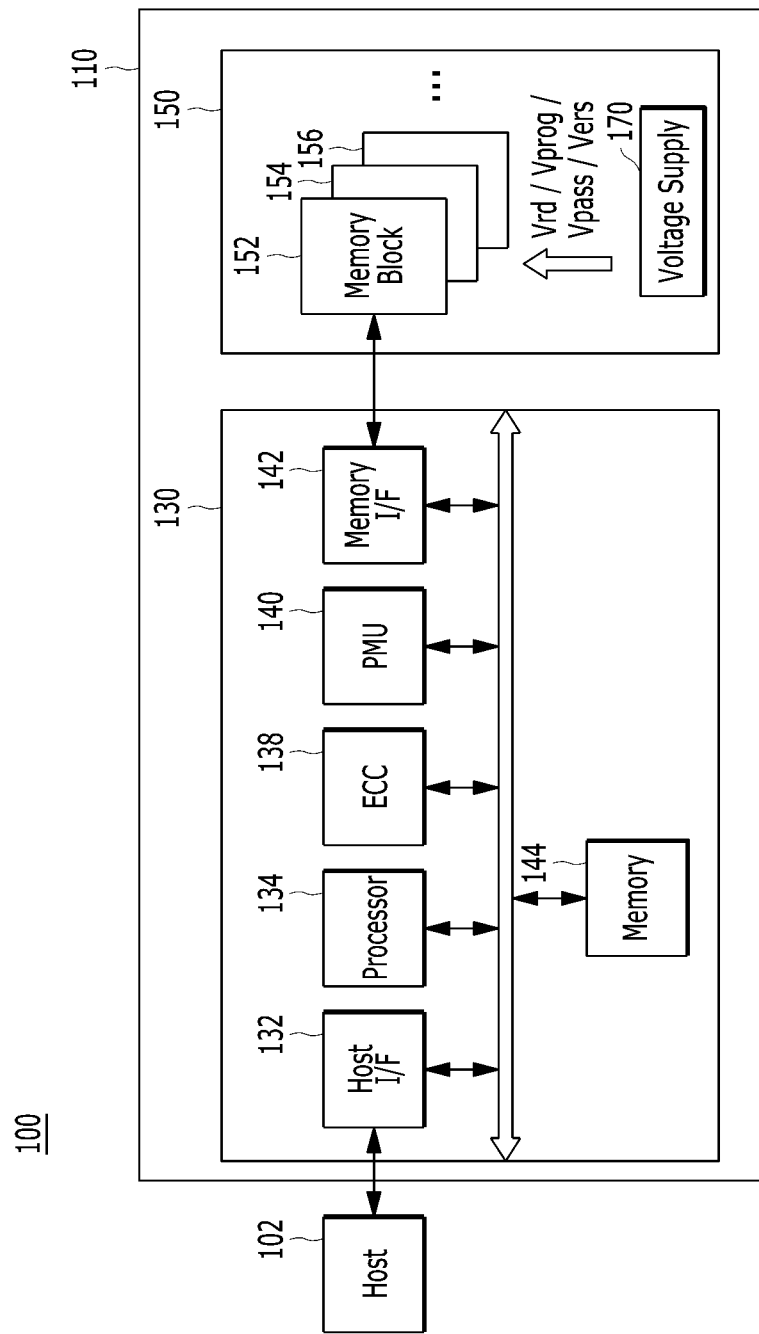
FIG. 2 illustrates a data processing system according to an embodiment of the present disclosure.

According to an embodiment of the present disclosure, the memory group 330 shown in FIG. 1 may include at least one memory block 152, 154, 156 included in the memory device 150 shown in FIG. 2. According to an embodiment, the memory device 150 can have a two-dimensional (2D) or three-dimensional (3D) structure. For example, each of the memory blocks 152, 154, 156 in the memory device 150 may be implemented as a 3D structure (or a vertical structure). Each of the memory blocks 152, 154, 156 may have a three-dimensional structure extending along first to third directions, for example, an x-axis direction, a y-axis direction, and a z-axis direction.

The memory group 330 constituting the plurality of memory blocks 152, 154, 156 of the memory device 150 can be coupled to a plurality of bit lines BL, a plurality of string select lines SSL, a plurality of drain select lines DSL, a plurality of word lines WL, a plurality of dummy word lines DWL, and a plurality of common source lines CSL. The memory group 300 can include a plurality of NAND strings NS, each NAND string NS including a plurality of memory cells MC. In the memory group 330, each NAND string NS may be connected to each bit line BL. In addition, the string select transistor SST of each NAND string NS may be connected to a common source line CSL, and the drain select transistor DST of each NAND string NS can be connected to a corresponding bit line BL. Here, the memory cells MC may be arranged between the string select transistor SST and the drain select transistor DST of each NAND string NS.

Referring to FIG. 1, a voltage supply circuit 170 in the memory device 150 can supply a word line voltage (e.g., a subject voltage such as a program voltage, a read voltage, and a pass voltage) via each word line according to an operation mode, or supply a voltage to a bulk (e.g., a well region) in which each memory block including the memory cells MC are formed. In this case, a voltage generating operation of the voltage supply circuit 170 may be performed under a control of a control circuit (not shown). Also, the voltage supply circuit 170 may generate a plurality of variable read voltages to distinguish a plurality of data items from each other. In response to the control of the control circuit, one of the memory blocks (or sectors) of the memory cell array may be selected, and one of the word lines of the selected memory block may be selected. Word line voltages may be supplied to the selected word line and the unselected word line, individually. The voltage supply circuit 170 may include a voltage generation circuit (refer to FIGS. 4 to 8) for generating target voltages having various levels. The voltage supply circuit 170 may be coupled to a first pin or pad receiving a first power voltage VCC applied from the outside (e.g., an external device) and a second pin or pad receiving the second power voltage VPP applied from the external device. Here, the second power voltage VPP may have a voltage level twice or more higher than that of the first power voltage VCC. For example, the first power voltage VCC may have a voltage level of 2.0V to 5.5V, while the second power supply voltage may have a voltage level of 9V to 13V. The voltage supply circuit 170 according to an embodiment of the present disclosure can include a voltage generation circuit for more rapidly generating the target voltages of various levels used in the memory group 330. The voltage generation circuit can use the second power supply voltage VPP to generate a target voltage which has a higher voltage level than the second power voltage VPP.

A read/write circuit 320 controlled by the control circuit of the memory device 150 may operate as a sense amplifier or a write driver according to an operation mode. For example, in a verify operation and a read operation, the read/write circuit 320 may operate as a sense amplifier for reading the data item from the memory cell array. Also, in a program operation, the read/write circuit 320 may operate as a write driver that controls potentials of bit lines according to a data item to be stored in the memory cell array. The read/write circuit 320 may receive the data item to be programmed to the cell array from page buffers (not shown) during the program operation. The read/write circuit 320 can drive bit lines based on the input data item. To this end, the read/write circuit 320 includes a plurality of page buffers (PB) 322, 324, 326, each page buffer corresponding to each column (or each bit line) or each column pair (or each bit line pair). According to an embodiment, a plurality of latches (not shown) may be included in each of the page buffers 322, 324, 326.

Although not shown, the page buffers 322, 324, 326 may be coupled to a data input/output device (e.g., a serialization circuit or a serializer) through a plurality of buses BUS. When each of the page buffers 322, 324, 326 is coupled to the data input/output device through different buses, a delay that may occur in data transmission from the page buffers 322, 324, 326 can be reduced. For example, each page buffer 322, 324, 326 can perform the data transmission without any waiting time.

According to an embodiment, the memory device 150 may receive a write command, write data, and information (e.g., a physical address) regarding a location in which the write data is to be stored. The control circuit 180 causes the voltage supply circuit 170 to generate a program pulse, a pass voltage, etc. used for a program operation performed in response to a write command, and generates various voltages used for a verification operation performed after the program operation.

An error rate when multi-bit data item is programmed in non-volatile memory cells included in the memory group 330 might be higher than that when a single-bit data item is stored in the non-volatile memory cells. For example, an error in the non-volatile memory cells may be induced due to cell-to-cell interference (CCI). In order to reduce an error in the non-volatile memory cells, a width (deviation) of a threshold voltage distribution corresponding to stored data items between the non-volatile memory cells should be reduced. To this end, the memory device 150 can use a program technique called an incremental step pulse programming (ISPP) operation to effectively make a narrow threshold voltage distribution of the non-volatile memory cells. The memory device 150 can use the ISPP operation for multi-step program operations. For example, the memory device 150 may divide a program operation into a Least Significant Bit (LSB) program operation and a Most Significant Bit (MSB) operation according to a predetermined order between the non-volatile memory cells or pages.

According to an embodiment of the present disclosure, it is possible to provide an apparatus and method capable of reducing a time for discharging a bit line or a channel between program pulse applications during an operation of programming data by applying a plurality of program pulses to memory cells in a memory device, thereby speeding up the program operation of the memory device. Specifically, in order to discharge a bit line or a channel in the memory device, the memory device can determine, control, or adjust a voltage level of a pass voltage, which is applied to unselected word lines, based on an operating environment such as a temperature or a number of program pulse application (e.g., how many program pulses are applied to a selected word line during a data program operation).

Specifically, according to an embodiment, the memory device can perform over-driving of pass voltage, which is applied to at least one unselected word line, for a predetermined time to discharge a bit line or a channel in the memory device during a program operation. For example, the memory device 150 can apply a pass voltage having a first level to at least one word line coupled to non-volatile memory cells which are in an erased state, as well as apply a pass voltage having a second level to at least one word line coupled to non-volatile memory cells which are programmed. Herein, the second level is higher than the first level. Accordingly, the memory device may reduce an operation margin corresponding to each program pulse during an operation of programming data by applying a plurality of program pulses to a non-volatile memory cell, so that the memory device may reduce a time spent on the operation of programming data.

FIG. 2 illustrates a data processing system 100 according to an embodiment of the present disclosure.

Referring to FIG. 2, the data processing system 100 may include a host 102 engaged or coupled with a memory system, such as memory system 110. For example, the host 102 and the memory system 110 can be coupled to each other via a data bus, a host cable and the like to perform data communication.

The memory system 110 may include a memory device 150 and a controller 130. The memory device 150 and the controller 130 in the memory system 110 may be considered components or elements physically separated from each other. The memory device 150 and the controller 130 may be connected via at least one data path. For example, the data path may include a channel and/or a way.

According to an embodiment, the memory device 150 and the controller 130 may be components or elements functionally divided. Further, according to an embodiment, the memory device 150 and the controller 130 may be implemented with a single chip or a plurality of chips. The controller 130 may perform a data input/output operation in response to a request input from the external device. For example, when the controller 130 performs a read operation in response to a read request input from an external device, data stored in a plurality of non-volatile memory cells included in the memory device 150 is transferred to the controller 130.

As shown in FIG. 2, the memory device 150 may include a plurality of memory blocks 152, 154, 156. The memory block 152, 154, 156 may be understood as a group of non-volatile memory cells in which data is removed together by a single erase operation. Although not illustrated, the memory block 152, 154, 156 may include a page which is a group of non-volatile memory cells that store data together during a single program operation or output data together during a single read operation. For example, one memory block may include a plurality of pages.

For example, the memory device 150 may include a plurality of memory planes or a plurality of memory dies. According to an embodiment, the memory plane may be considered a logical or a physical partition including at least one memory block, a driving circuit capable of controlling an array including a plurality of non-volatile memory cells, and a buffer that can temporarily store data inputted to, or outputted from, non-volatile memory cells.

In addition, according to an embodiment, the memory die may include at least one memory plane. The memory die may be understood as a set of components implemented on a physically distinguishable substrate. Each memory die may be connected to the controller 130 through a data path. Each memory die may include an interface to exchange an item of data and a signal with the controller 130.

According to an embodiment, the memory device 150 may include at least one memory block 152, 154, 156, at least one memory plane, or at least one memory die. The internal configuration of the memory device 150 shown in FIG. 1 may be different according to performance of the memory system 110. An embodiment of the present disclosure is not limited to the internal configuration shown in FIG. 2.

Referring to FIG. 2, the memory device 150 may include the voltage supply circuit 170 capable of supplying at least some voltage into the memory block 152, 154, 156. The voltage supply circuit 170 can include a voltage generation circuit used for generating target voltages used in the memory block 152, 154, 156, referring to FIGS. 4 to 8. The voltage supply circuit 170 may supply a read voltage Vrd, a program voltage Vprog, a pass voltage Vpass, or an erase voltage Vers into a non-volatile memory cell included in the memory block. For example, during a read operation for reading data stored in the non-volatile memory cell included in the memory block 152, 154, 156, the voltage supply circuit 170 may supply the read voltage Vrd into a selected non-volatile memory cell. During the program operation for storing data in the non-volatile memory cell included in the memory block 152, 154, 156, the voltage supply circuit 170 may supply the program voltage Vprog into a selected non-volatile memory cell. Also, during a read operation or a program operation performed on the selected non-volatile memory cell, the voltage supply circuit 170 may supply a pass voltage Vpass into a non-selected non-volatile memory cell. During the erasing operation for erasing data stored in the non-volatile memory cell included in the memory block 152, 154, 156, the voltage supply circuit 170 may supply the erase voltage Vers into the memory block.

The memory device 150 may store information regarding various voltages which are supplied to the memory block 152, 154, 156 based on which operation is performed. For example, when a non-volatile memory cell in the memory block 152, 154, 156 can store multi-bit data, plural levels of the read voltage Vrd for recognizing or reading the multi-bit data item may be required. The memory device 150 may include a table including information corresponding to plural levels of the read voltage Vrd, corresponding to the multi-bit data item. For example, the table can include bias values stored in a register, each bias value corresponding to a specific level of the read voltage Vrd. The number of bias values for the read voltage Vrd that is used for a read operation may be limited to a preset range. Also, the bias values can be quantized.

The host 102 may include a portable electronic device (e.g., a mobile phone, an MP3 player, a laptop computer, etc.) or a non-portable electronic device (e.g., a desktop computer, a game player, a television, a projector, etc.). According to an embodiment, the host 102 can include a central processing unit (CPU) included in the portable electronic device and the non-portable electronic device.

The host 102 may also include at least one operating system (OS), which can control functions and operations performed in the host 102. The OS can provide interoperability between the host 102 engaged operatively with the memory system 110 and a user who intends to store data in the memory system 110. The OS may support functions and operations corresponding to a user's requests. By way of example but not limitation, the OS can be classified into a general operating system and a mobile operating system according to mobility of the host 102. The general operating system may be split into a personal operating system and an enterprise operating system according to system requirements or a user environment. As compared with the personal operating system, the enterprise operating systems can be specialized for securing and supporting high performance computing.

The mobile operating system may be subject to support services or functions for mobility (e.g., a power saving function). The host 102 may include a plurality of operating systems. The host 102 may execute multiple operating systems interlocked with the memory system 110, corresponding to a user's request. The host 102 may transmit a plurality of commands corresponding to the user's requests into the memory system 110, thereby performing operations corresponding to the plurality of commands within the memory system 110.

A controller 130 in the memory system 110 may control a memory device 150 in response to a request or a command input from the host 102. For example, the controller 130 may perform a read operation to provide data read from the memory device 150 to the host 102 and may perform a write operation (or a program operation) to store data input from the host 102 in the memory device 150. In order to perform data input/output (I/O) operations, the controller 130 may control and manage internal operations of reading data, programming data, erasing data, or the like.

According to an embodiment, the controller 130 may include a host interface 132, a processor 134, error correction circuitry (ECC) 138, a power management unit (PMU) 140, a memory interface 142, and a memory 144. Components included in the controller 130 as illustrated in FIG. 2 may vary according to structures, functions, operation performance, or the like, regarding the memory system 110.

For example, the memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. Components may be added to or omitted from the controller 130 according to implementation of the memory system 110.

The host 102 and the memory system 110 each may include a controller or an interface for transmitting and receiving signals, data, and the like, in accordance with one or more predetermined protocols. For example, the host interface 132 in the memory system 110 may include an apparatus capable of transmitting signals, data, and the like to the host 102 or receiving signals, data, and the like from the host 102.

The host interface 132 included in the controller 130 may receive signals, commands (or requests), and/or data input from the host 102. For example, the host 102 and the memory system 110 may use a predetermined protocol to transmit and receive data therebetween. Examples of communication standards, protocols or interfaces supported by the host 102 and the memory system 110 for sending and receiving data include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIe or PCI-e), Serial-attached SCSI (SAS), Serial Advanced Technology Attachment (SATA), Mobile Industry Processor Interface (MIPI), and the like. According to an embodiment, the host interface 132 is a type of layer for exchanging data with the host 102 and is implemented with, or driven by, firmware called a host interface layer (HIL).

The Integrated Drive Electronics (IDE) or Advanced Technology Attachment (ATA) may be used as one of the interfaces for transmitting and receiving data and, for example, may use a cable including 40 wires connected in parallel to support data transmission and data reception between the host 102 and the memory system 110. When a plurality of memory systems 110 are connected to a single host 102, the plurality of memory systems 110 may be divided into a master and a slave by using a position or a dip switch to which the plurality of memory systems 110 are connected. The memory system 110 set as the master may be used as a main memory device. The IDE (ATA) may include, for example, Fast-ATA, ATAPI, or Enhanced IDE (EIDE).

A Serial Advanced Technology Attachment (SATA) interface is a type of serial data communication interface that is compatible with various ATA standards of parallel data communication interfaces which are used by Integrated Drive Electronics (IDE) devices. The 40 wires in the IDE interface can be reduced to six wires in the SATA interface. For example, 40 parallel signals for the IDE can be converted into 6 serial signals for the SATA interface. The SATA interface has been widely used because of its faster data transmission and reception rate and its less resource consumption in the host 102 used for the data transmission and reception. The SATA interface may connect up to 30 external devices to a single transceiver included in the host 102. In addition, the SATA interface can support hot plugging that allows an external device to be attached to or detached from the host 102, even while data communication between the host 102 and another device is being executed. Thus, the memory system 110 can be connected or disconnected as an additional device, like a device supported by a universal serial bus (USB) even when the host 102 is powered on. For example, in the host 102 having an eSATA port, the memory system 110 may be freely attached to or detached from the host 102 like an external hard disk.

Small Computer System Interface (SCSI) is a type of serial data communication interface used for connecting a computer or a server with other peripheral devices. The SCSI can provide a high transmission speed, as compared with other interfaces such as IDE and SATA. In the SCSI, the host 102 and at least one peripheral device (e.g., memory system 110) are connected in series, but data transmission and reception between the host 102 and each peripheral device may be performed through parallel data communication. In the SCSI, it is easy to connect or disconnect a device such as the memory system 110 to or from the host 102. The SCSI can support connections of 15 other devices to a single transceiver included in host 102.

Serial Attached SCSI (SAS) can be understood as a serial data communication version of the SCSI. In the SAS, the host 102 and a plurality of peripheral devices are connected in series, and data transmission and reception between the host 102 and each peripheral device may be performed in a serial data communication scheme. The SAS can support connection between the host 102 and the peripheral device through a serial cable instead of a parallel cable, to easily manage equipment using the SAS and enhance or improve operational reliability and communication performance. The SAS may support connections of eight external devices to a single transceiver included in the host 102.

The Non-volatile memory express (NVMe) is a type of interface based at least on a Peripheral Component Interconnect Express (PCIe) designed to increase performance and design flexibility of the host 102, servers, computing devices, and the like equipped with the non-volatile memory system 110. The PCIe can use a slot or a specific cable for connecting a computing device (e.g., host 102) and a peripheral device (e.g., memory system 110). For example, the PCIe can use a plurality of pins (e.g., 18 pins, 32 pins, 49 pins, or 82 pins) and at least one wire (e.g., x1, x4, x8, or x16) to achieve high speed data communication over several hundred MB per second (e.g., 250 MB/s, 500 MB/s, 984.6250 MB/s, or 1969 MB/s). According to an embodiment, the PCIe scheme may achieve bandwidths of tens to hundreds of Giga bits per second. The NVMe can support an operation speed of the non-volatile memory system 110, such as an SSD, that is faster than a hard disk.

According to an embodiment, the host 102 and the memory system 110 may be connected through a universal serial bus (USB). The Universal Serial Bus (USB) is a type of scalable, hot-pluggable plug-and-play serial interface that can provide cost-effective standard connectivity between the host 102 and peripheral devices such as a keyboard, a mouse, a joystick, a printer, a scanner, a storage device, a modem, a video camera, and the like. A plurality of peripheral devices such as the memory system 110 may be coupled to a single transceiver included in the host 102.

Referring to FIG. 2, the error correction circuitry 138 can correct error bits of data read from the memory device 150, and may include an error correction code (ECC) encoder and an ECC decoder. The ECC encoder may perform error correction encoding of data to be programmed in the memory device 150 to generate encoded data into which a parity bit is added, and store the encoded data in memory device 150. The ECC decoder can detect and correct error bits contained in the data read from the memory device 150 when the controller 130 reads the data stored in the memory device 150. For example, after performing error correction decoding on the data read from the memory device 150, the error correction circuitry 138 determines whether the error correction decoding has succeeded or not, and outputs an instruction signal (e.g., a correction success signal or a correction fail signal), based on a result of the error correction decoding. The error correction circuitry 138 may use a parity bit, which has been generated during the ECC encoding process for the data stored in the memory device 150, in order to correct the error bits of the read data. When the number of the error bits is greater than or equal to the number of correctable error bits, the error correction circuitry 138 may not correct the error bits and instead may output the correction fail signal indicating failure in correcting the error bits.

According to an embodiment, the error correction circuitry 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The error correction circuitry 138 may include all circuits, modules, systems, and/or devices for performing the error correction operation based on at least one of the above described codes. The error correction circuitry 138 shown in FIG. 2 can include at least some of components included in the controller 130.

For example, the ECC decoder may perform hard decision decoding or soft decision decoding on data transmitted from the memory device 150. The hard decision decoding can be understood as one of two methods broadly classified for error correction. The hard decision decoding may include an operation of correcting an error bit by reading digital data of '0' or '1' from a non-volatile memory cell in the memory device 150. Because the hard decision decoding handles a binary logic signal, the circuit/algorithm design or configuration may be simpler and a processing speed may be faster than the soft decision decoding.

The soft decision decoding may quantize a threshold voltage of a non-volatile memory cell in the memory device 150 by two or more quantized values (e.g., multiple bit data, approximate values, an analog value, and the like) in order to correct an error bit based on the two or more quantized values. The controller 130 can receive two or more alphabets or quantized values from a plurality of non-volatile memory cells in the memory device 150, and then perform a decoding based on information generated by characterizing the quantized values as a combination of information such as conditional probability or likelihood.

According to an embodiment, the ECC decoder may use low-density parity-check and generator matrix (LDPC-GM) code among methods designed for the soft decision decoding. The low-density parity-check (LDPC) code uses an algorithm that can read values of data from the memory device 150 in several bits according to reliability, not simply data of 1 or 0 like the hard decision decoding, and iteratively repeats it through a message exchange in order to improve reliability of the values. Then, the values are finally determined as data of 1 or 0. For example, a decoding algorithm using LDPC codes can be understood as probabilistic decoding. The hard decision decoding in which a value output from a non-volatile memory cell is coded as 0 or 1. Compared to the hard decision decoding, the soft decision decoding can determine the value stored in the non-volatile memory cell based on the stochastic information. Regarding bit-flipping (which may be considered an error that can occur in the memory device 150), the soft decision decoding may provide improved probability of correcting the error and recovering data, as well as providing reliability and stability of corrected data. The LDPC-GM code may have a scheme in which internal LDGM codes can be concatenated in series with high-speed LDPC codes.

According to an embodiment, the ECC decoder may use, for example, low-density parity-check convolutional codes (LDPC-CCs) for the soft decision decoding. The LDPC-CCs may have a scheme using a linear time encoding and a pipeline decoding based on a variable block length and a shift register.

According to an embodiment, the ECC decoder may use, for example, a Log Likelihood Ratio Turbo Code (LLR-TC) for the soft decision decoding. A Log Likelihood Ratio (LLR) may be calculated as a non-linear function for a distance between a sampled value and an ideal value. In addition, a Turbo Code (TC) may include a simple code (for example, a Hamming code) in two or three dimensions and repeat decoding in a row direction and a column direction to improve reliability of values.

The power management unit (PMU) 140 may control electrical power provided to the controller 130. The PMU 140 may monitor the electrical power supplied to the memory system 110 (e.g., a voltage supplied to the controller 130) and provide the electrical power to components included in the controller 130. The PMU 140 may not only detect power-on or power-off, but also generate a trigger signal to enable the memory system 110 to urgently back up a current state when the electrical power supplied to the memory system 110 is unstable. According to an embodiment, the PMU 140 may include a device or a component capable of accumulating electrical power that may be used in an emergency.

The memory interface 142 may serve as an interface for handling commands and data transferred between the controller 130 and the memory device 150, in order to allow the controller 130 to control the memory device 150 in response to a command or a request input from the host 102. In a case when the memory device 150 is a flash memory, the memory interface 142 may generate a control signal for the memory device 150 and may process data input to, or output from, the memory device 150 under the control of the processor 134.

For example, when the memory device 150 includes a NAND flash memory, the memory interface 142 includes a NAND flash controller (NFC). The memory interface 142 can provide an interface for handling commands and data between the controller 130 and the memory device 150. In accordance with an embodiment, the memory interface 142 can be implemented through, or driven by, firmware called a Flash Interface Layer (FIL) for exchanging data with the memory device 150.

According to an embodiment, the memory interface 142 may support an open NAND flash interface (ONFi), a toggle mode, or the like, for data input/output with the memory device 150. For example, the ONFi may use a data path (e.g., a channel, a way, etc.) that includes at least one signal line capable of supporting bi-directional transmission and reception in a unit of 8-bit or 16-bit data. Data communication between the controller 130 and the memory device 150 can be achieved through at least one interface regarding an asynchronous single data rate (SDR), a synchronous double data rate (DDR), a toggle double data rate (DDR), or the like.

The memory 144 may be used as a working memory of the memory system 110 or the controller 130, while temporarily storing transactional data of operations performed in the memory system 110 and the controller 130. For example, the memory 144 may temporarily store read data output from the memory device 150 in response to a read request from the host 102 before the read data is output to the host 102. In addition, the controller 130 may temporarily store write data input from the host 102 in the memory 144 before programming the write data in the memory device 150. When the controller 130 controls operations, such as a data read operation, a data write or program operation, a data erase operation, etc., of the memory device 150, data transmitted between the controller 130 and the memory device 150 of the memory system 110 may be temporarily stored in the memory 144.

In addition to the read data or write data, the memory 144 may store information (e.g., map data, read requests, program requests, etc.) used for inputting or outputting data between the host 102 and the memory device 150. According to an embodiment, the memory 144 may include one or more of a command queue, a program memory, a data memory, a write buffer/cache, a read buffer/cache, a data buffer/cache, a map buffer/cache, and so on. The controller 130 may allocate some storage space in the memory 144 for a component which is established to carry out a data input/output operation. For example, the write buffer established in the memory 144 may be used to temporarily store target data subject to a program operation.

In an embodiment, the memory 144 may be implemented with a volatile memory. For example, the memory 144 may be implemented with a static random access memory (SRAM), a dynamic random access memory (DRAM), or both. Although FIG. 2 illustrates, for example, the memory 144 disposed within the controller 130, embodiments are not limited thereto. The memory 144 may be located within or external to the controller 130. For instance, the memory 144 may be embodied by an external volatile memory having a memory interface transferring data and/or signals between the memory 144 and the controller 130.

The processor 134 may control the overall operations of the memory system 110. For example, the processor 134 can control a program operation or a read operation of the memory device 150 in response to a write request or a read request entered from the host 102. According to an embodiment, the processor 134 may execute firmware to control the program operation or the read operation in the memory system 110. Herein, the firmware may be referred to as a flash translation layer (FTL). According to an embodiment, the processor 134 may be implemented with a microprocessor, a central processing unit (CPU), or the like.

According to an embodiment, the memory system 110 may be implemented with at least one multi-core processor. The multi-core processor is a type of circuit or chip in which two or more cores, which are considered distinct processing regions, are integrated. For example, when a plurality of cores in the multi-core processor drive or execute a plurality of flash translation layers (FTLs) independently, a data input/output speed (or performance) of the memory system 110 may be improved. According to an embodiment, the data input/output (I/O) operations in the memory system 110 may be independently performed through different cores in the multi-core processor.

The processor 134 in the controller 130 may perform an operation corresponding to a request or a command input from the host 102. Further, the memory system 110 may perform an operation independent from a command or a request input from the host 102. In one case, an operation performed by the controller 130 in response to the request or the command input from the host 102 may be considered a foreground operation, while an operation performed by the controller 130 independently from the request or the command input from the host 102 may be considered a background operation. The controller 130 can perform foreground or background operations for reading, writing, or erasing data in the memory device 150. In addition, a parameter set operation corresponding to a set parameter command or a set feature command as a set command transmitted from the host 102 may be considered a foreground operation. Background operations that may be performed without a command transmitted from the host 102. For example, the controller 130 can perform garbage collection (GC), wear leveling (WL), bad block management for identifying and processing bad blocks, or the like.

According to an embodiment, substantially similar operations may be performed as both the foreground operation and the background operation. For example, when the memory system 110 performs garbage collection in response to a request or a command input from the host 102 (e.g., Manual GC), the garbage collection can be considered a foreground operation. When the memory system 110 performs garbage collection independently of the host 102 (e.g., Auto GC), the garbage collection can be considered a background operation.

When the memory device 150 includes a plurality of dies (or a plurality of chips) each including a plurality of non-volatile memory cells, the controller 130 may perform parallel processing regarding plural requests or commands input from the host 102 in order to improve performance of the memory system 110. For example, the transmitted requests or commands may be divided into plural groups including at least some of a plurality of planes, a plurality of dies, or a plurality of chips included in the memory device 150, and the plural groups of requests or commands are processed individually or in parallel in each plane, each die or each chip.

The memory interface 142 in the controller 130 may be connected to the plurality of dies or chips in the memory device 150 through at least one channel and at least one way. When the controller 130 distributes and stores data in the plurality of dies through each channel or each way in response to requests or commands associated with a plurality of pages including non-volatile memory cells, a plurality of operations corresponding to the requests or the commands can be performed simultaneously or in parallel in the plurality of dies or planes. Such a processing method or scheme can be considered as an interleaving method. Because a data input/output speed of the memory system 110 increases by operating with the interleaving method, data I/O performance of the memory system 110 can be improved.

By way of example but not limitation, the controller 130 can recognize statuses of a plurality of channels (or ways) associated with the plurality of dies included in the memory device 150. The controller 130 may determine a status of each channel or each way as one of a busy status, a ready status, an active status, an idle status, a normal status, and an abnormal status. The determination of which channel or way an instruction (and/or a data) is delivered through by the controller can be associated with a physical block address. The controller 130 may refer to descriptors delivered from the memory device 150. The descriptors may include a block or page of parameters describing something about the memory device 150. The descriptors can have a predetermined format or structure. For instance, the descriptors may include device descriptors, configuration descriptors, unit descriptors, and the like. The controller 130 may refer to, or use, the descriptors to determine which channel(s) or way(s) is used to exchange an instruction or data.

Referring to FIG. 2, the memory device 150 in the memory system 110 may include a plurality of memory blocks 152, 154, 156. Each of the plurality of memory blocks 152, 154, 156 includes a plurality of non-volatile memory cells. According to an embodiment, the memory block 152, 154, 156 can be a group of non-volatile memory cells erased together. The memory block 152, 154, 156 may include a plurality of pages which is a group of non-volatile memory cells read or programmed together.

In an embodiment, each memory block 152, 154, or 156 may have a three-dimensional stack structure for high integration. Further, the memory device 150 may include a plurality of dies, each die including a plurality of planes, each plane including the plurality of memory blocks 152, 154, 156. A configuration of the memory device 150 may be changed depending on performance of the memory system 110.

FIG. 2 illustrates the memory device 150 that includes the plurality of memory blocks 152, 154, and 156. The plurality of memory blocks 152, 154, and 156 may be any of single-level cell (SLC) memory blocks, multi-level cell (MLC) memory blocks, or the like, according to the number of bits that can be stored in one memory cell. An SLC memory block includes a plurality of pages implemented by memory cells, each memory cell storing one bit of data. An SLC memory block may have higher data I/O operation performance and higher durability than the MLC memory block. The MLC memory block includes a plurality of pages implemented by memory cells, each memory cell storing multi-bit data (e.g., two or more bits of data). The MLC memory block may have larger storage capacity for the same space compared to the SLC memory block. The MLC memory block can be highly integrated in view of storage capacity.

In an embodiment, the memory device 150 may be implemented with MLC memory blocks such as a double level cell (DLC) memory block, a triple-level cell (TLC) memory block, a quadruple-level cell (QLC) memory block, and a combination thereof. The DLC memory block may include a plurality of pages implemented by memory cells, each memory cell capable of storing 2-bit data. The TLC memory block can include a plurality of pages implemented by memory cells, each memory cell capable of storing 3-bit data. The QLC memory block can include a plurality of pages implemented by memory cells, each memory cell capable of storing 4-bit data. In another embodiment, the memory device 150 can be implemented with a block including a plurality of pages implemented by memory cells, each memory cell capable of storing five or more bits of data.

According to an embodiment, the controller 130 may use a MLC memory block included in the memory device 150 as an SLC memory block that stores one-bit data in one memory cell. A data input/output speed of the multi-level cell (MLC) memory block can be slower than that of the SLC memory block. That is, when the MLC memory block is used as the SLC memory block, a margin for a read or program operation can be reduced. For example, the controller 130 may perform a data input/output operation with a higher speed when the MLC memory block is used as the SLC memory block. Thus, the controller 130 may use the MLC memory block as a SLC buffer to temporarily store data because the buffer may require a high data input/output speed for improving performance of the memory system 110.

Further, according to an embodiment, the controller 130 can program data in a MLC a plurality of times without performing an erase operation on a specific MLC memory block included in the memory device 150. In general, non-volatile memory cells do not support data overwrite. However, the controller 130 may program 1-bit data in the MLC a plurality of times using a feature in which the MLC is capable of storing multi-bit data. For a MLC overwrite operation, the controller 130 may store the number of program times as separate operation information when 1-bit data is programmed in a MLC. According to an embodiment, an operation for uniformly levelling threshold voltages of the MLCs may be carried out before another 1-bit data is programmed in the same MLCs, each having stored another-bit data.

In an embodiment, the memory device 150 is embodied as a non-volatile memory such as a flash memory, for example, as a NAND flash memory, a NOR flash memory, or the like. In another embodiment, the memory device 150 may be implemented by at least one of a phase change random access memory (PCRAM), a ferroelectrics random access memory (FRAM), a spin transfer torque random access memory (SU-RAM), and a spin transfer torque magnetic random access memory (STT-MRAM), or the like.

Figure 3:
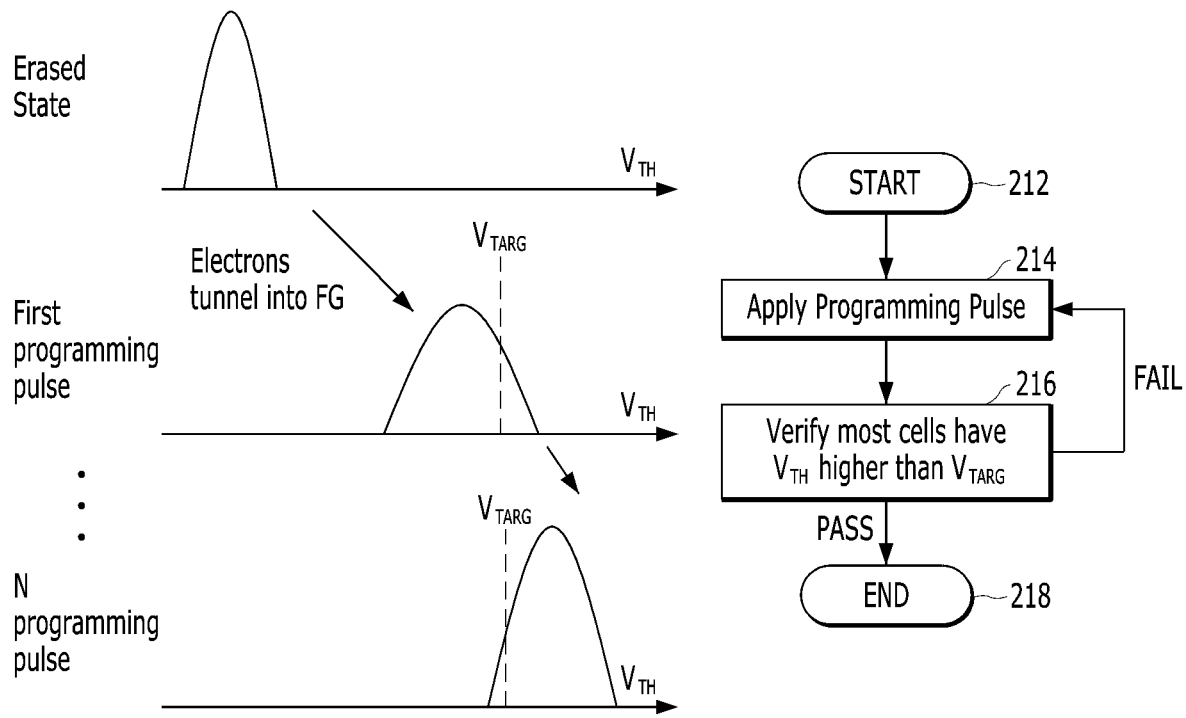
FIG. 3 illustrates an Incremental Step Pulse Programming (ISPP) operation according to an embodiment of the present disclosure.

FIG. 3 illustrates an Incremental Step Pulse Programming (ISPP) operation according to an embodiment of the present disclosure.

Referring to FIG. 3, data may be programmed in a non-volatile memory cell being in an erased state. When a programming pulse is supplied to a word line coupled to the non-volatile memory cell, the threshold voltage distribution of the non-volatile memory cell may shift from the erased state to the right (a direction in which the threshold voltage increases). If the programming pulse is continuously supplied to the non-volatile memory cell, the threshold voltage distribution of the non-volatile memory cell may continuously shift to the right. The programming pulse may be supplied until most of the plurality of non-volatile memory cells have a threshold voltage higher than the target voltage VTARG in a threshold voltage distribution.

More specifically, when a program operation starts (operation 212), the memory device 150 can apply a programming pulse to a plurality of non-volatile memory cells to be programmed with data (operation 214). After a programming pulse is applied, the memory device 150 can verify whether most of the plurality of non-volatile memory cells have a threshold voltage VTH higher than the target voltage VTARG (operation 216). When it is determined that most of the plurality of non-volatile memory cells do not have a threshold voltage VTH higher than the target voltage VTARG according to a verification result FAIL, the memory device 150 applies another programming pulse to the corresponding non-volatile memory cells (operation 214). When most of the plurality of non-volatile memory cells have a threshold voltage VTH higher than the target voltage VTARG according to another verification result PASS, the memory device 150 may end the program operation (operation 218).

In order to narrow the threshold voltage distribution of the plurality of non-volatile memory cells, it is advantageous to slightly shift the threshold voltage distribution of the plurality of non-volatile memory cells to the right rather than greatly shifting them to the right when a single programming pulse is applied. On the other hand, when the threshold voltage distribution of the plurality of non-volatile memory cells is slightly shifted to the right, the number of times the programming pulse is applied may increase. According to an embodiment, it may be three times or more than the number of bits of data that can be stored in the non-volatile memory cell. For example, when 2 bits of data can be stored in a non-volatile memory cell, the non-volatile memory cell may have four programmed states (e.g., '00', '01', '10', and '11') corresponding to 2-bit data. In order to form a tighter threshold voltage distribution (i.e., a narrower distribution), a degree to which the threshold voltage distribution of a plurality of non-volatile memory cells is shifted to the right, in response to a single programming pulse, can be smaller than a difference in two adjacent programmed states. For example, when two or more programming pulses are applied, it can be designed to move by a difference between two adjacent programmed states. In this case, the number of times of applying the programming pulse may be 8 times or more, which is more than 4 times than the number of bits of data.

Figure 6:
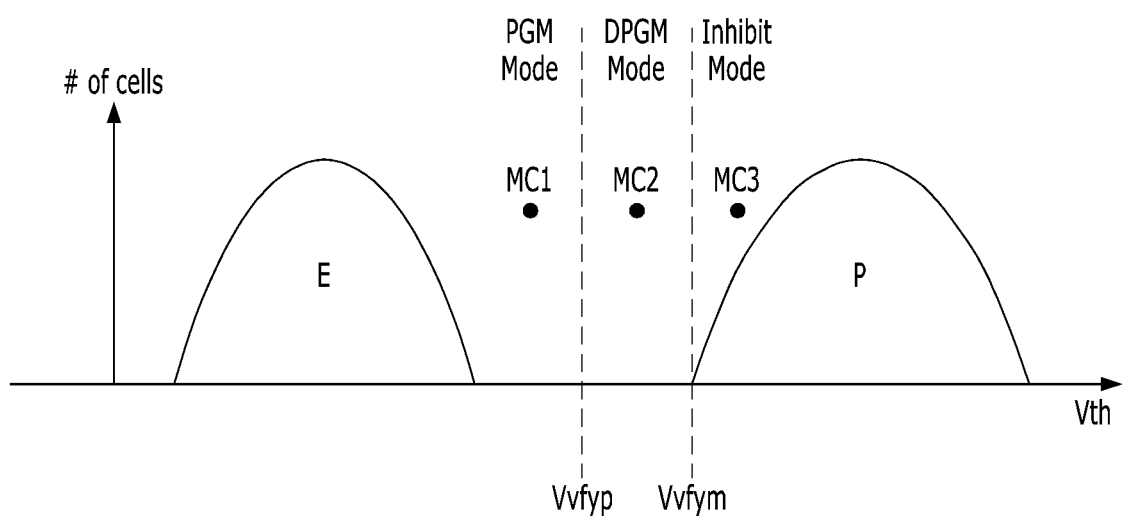
FIG. 6 illustrates a program operation according to an embodiment of the present disclosure.

According to an embodiment of the present disclosure, the degree to which the threshold voltage distribution of the plurality of non-volatile memory cells moves when a single programming pulse is applied may be understood as a target level. Referring to FIG. 6, the target level will be described in more detail.

Figure 4:
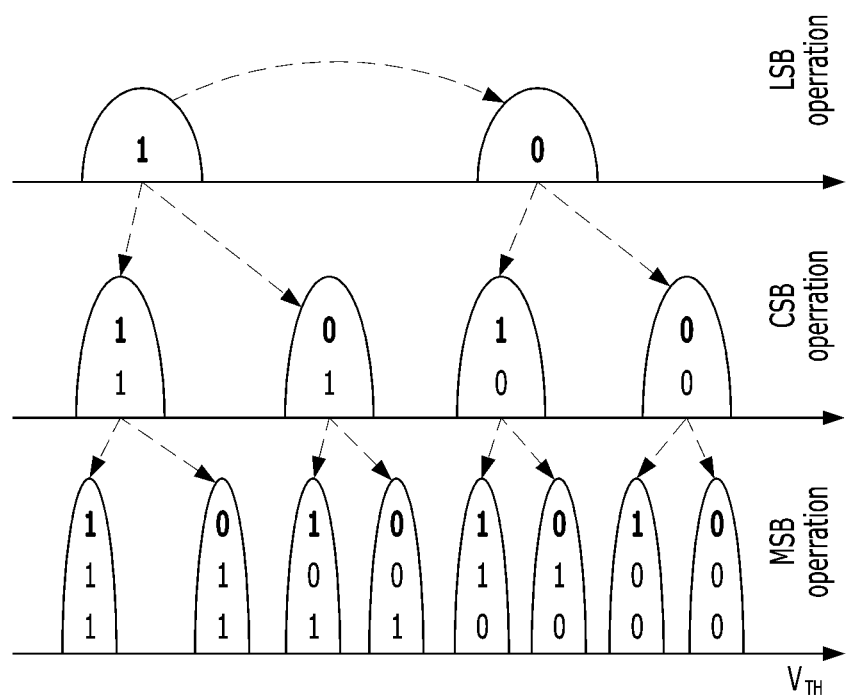
FIG. 4 illustrates a method for storing multi-bit data in a non-volatile memory cell according to an embodiment of the present disclosure.

FIG. 4 illustrates a method for storing multi-bit data in a non-volatile memory cell according to an embodiment of the present disclosure. FIG. 4 illustrates a program operation performed in the memory device 150 including non-volatile memory cells, each capable of storing 3-bit data.

Data stored in the non-volatile memory cell may be distinguishable based on a level of threshold voltage $V_{TH}$ of the corresponding memory cell. The threshold voltage $V_{TH}$ of the memory cell can vary depending on a quantity of electrons or charges injected into a floating gate of the corresponding memory cell. A single-level cell SLC may be divided into two ranges of the threshold voltage VTH, to store 1-bit data of "0" or "1". On the other hand, a triple-level cell TLC in the memory device 150 may have eight threshold voltage ranges.

Referring to FIG. 4, in order to reduce the number of applications of programming pulses in an incremental step pulse programming (ISPP) operation, the application of program pulses applied to the triple level cell TLC in response to bits of data stored in the triple level cell TLC can be controlled differently. Data stored in the triple-level cell TLC can be divided into LSB data, CSB data, and MSB data. In a process of programming the LSB data, the number of times of applying the programming pulses may be the smallest, and the number of times of applying the programming pulses in a process of programming the CSB data may be greater than that of programming the LSB data. In a process of programming the MSB data, the number of times of applying the programming pulses can be the largest.

In a memory device including a triple-level cell (TLC), each physical page may be divided into three logical pages that are an LSB page, a CSB page, and an MSB page. A programming pulse applied to each page can be different. That is, shifts of different positive threshold voltage (VTH) distributions may be induced in processes of programming the LSB, CSB, and MSB data. For example, the threshold voltages VTH of the plurality of non-volatile memory cells can move the most in the process of programming the LSB page, and the threshold voltages VTH of the plurality of non-volatile memory cells can move the least in a process of programming the MSB page. According to an embodiment, when the number of times a programming pulse is applied in the process of programming the LSB page is the least, delay time can be the shortest and power consumption can also be the smallest. On the other hand, in the process of programming the MSB page, the number of times that the programming pulse is applied may increase so that the delay time and the power consumption can be increased.

Figure 5:
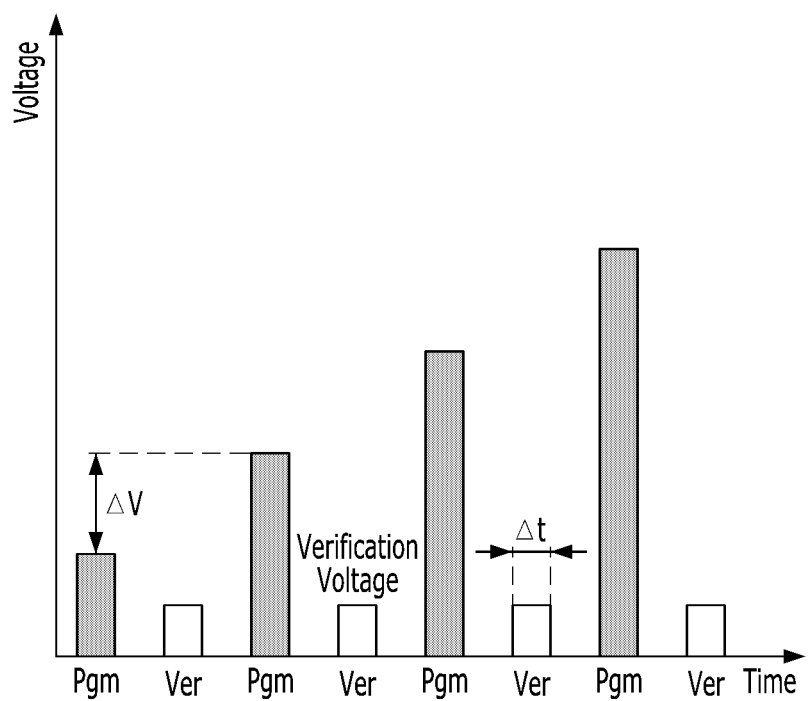
FIG. 5 illustrates a program operation and a verification operation of the Incremental Step Pulse Programming (ISPP) operation according to an embodiment of the present disclosure.

FIG. 5 illustrates a program voltage application operation and a verification operation of the ISPP operation according to an embodiment of the present disclosure.

Referring to FIG. 5, after the program voltage application operation Pgm is performed during the ISPP operation, the memory device 150 performs a verification operation Ver corresponding to the program voltage application operation Pgm. Each program voltage application operation Pgm can increase the threshold voltage $V_{TH}$ of the non-volatile memory cell. For example, each program voltage application operation Pgm increases the threshold voltage $V_{TH}$ of the non-volatile memory cell by the first potential difference ΔV. After the program voltage application operation Pgm is performed, the threshold voltage $V_{TH}$ of the non-volatile memory cell may be compared with a verification voltage in the verification operation. When the threshold voltage $V_{TH}$ of the non-volatile memory cell is lower than the verification voltage, the next program voltage application operation Pgm may be performed again to add more electrons into a floating gate of the non-volatile memory cell. Thereafter, the verification operation Ver is performed in response to the corresponding program voltage application operation Pgm. The repeated program voltage application operation Pgm may be performed until the threshold voltage $V_{TH}$ of the non-volatile memory cell reaches a target voltage (e.g., a verification voltage).

According to an embodiment, the number of repetitions of the program voltage application operation Pgm and the verification operation Ver may vary depending on a standby time or delay time, power consumption, accuracy, and the like. When the threshold voltage $V_{TH}$ of the non-volatile memory cell is finely increased through the program voltage application operation Pgm, accuracy of the program voltage application operation can be increased. However, delay time and power consumption can be longer and greater as a greater number of program voltage application operations can be performed. On the other hand, when the threshold voltage $V_{TH}$ of the non-volatile memory cell is greatly increased through each program voltage application operation Pgm, power consumption and operation time of the program voltage application operation Pgm may be increased and shorter. The operation times Δt of the program voltage application operation and the verify operation Ver may vary according to a goal of each program voltage application operation Pgm (e.g., a change of the threshold voltage $V_{TH}$).

Referring to FIGS. 4 and 5, in a memory device including a triple-level non-volatile memory cell TLC, the program voltage application operation Pgm and the verify operation Ver may be differently performed based on purpose and procedure of programming data in the least significant bit LSB, the center significant bit CSB and the most significant bit MSB of the memory cell. In FIG. 4, a memory device including a triple level non-volatile memory cell TLC has been described as an example, but the above-described program operation can also be applied to a memory device including a quadruple level non-volatile memory cell (QLC) for storing 4-bit data or a non-volatile memory cell capable of storing 5 or more-bit data.

According to an embodiment, for each program loop during the ISPP operation, a voltage level of the program pulse applied to the non-volatile memory cell in the program voltage application operation Pgm may be gradually increased by a preset voltage ΔV. However, a voltage level of the verification pulse applied to the non-volatile memory cell in the verification operation Ver corresponding to the program voltage application operation Pgm may be substantially the same (i.e., not changed). In the verification operation Ver for each program loop, substantially the same verification pulse is applied to the non-volatile memory cell, but the time Δt for applying the verification pulse may vary. Moreover, when the verification operation is performed by reflecting a noise generated according to operating characteristics of the memory device 150, the memory device 150 may change or adjust a voltage level of the verification pulse.

FIG. 6 illustrates a program operation according to an embodiment of the present disclosure. In FIG. 6, a non-volatile memory cell can store single-bit (1-bit) data. The memory device 150 may be controlled such that a threshold voltage of the non-volatile memory cell becomes one of an erase state E or a program state P. When the incremental step pulse programming (ISPP) operation is performed as described with reference to FIGS. 4 to 5, the threshold voltage of the non-volatile memory cell may be changed from the erase state E to the program state P.

Referring to FIG. 5, a verification operation may be performed after a program pulse is applied. Referring to FIG. 6, the verification operation may use two verification voltages Vvfp, Vvfym. Specifically, a data program operation supporting a double verify program (DPGM) operation may perform a verify operation with two different levels of verification voltage during a verify operation. Through the verification operation using two different verification voltage levels, a degree to which the non-volatile memory cell is programmed in response to a next program pulse may be adjusted. For example, the memory device 150 can determine how much of an amount of change in the threshold voltage could be caused by a next program pulse.

According to an embodiment, the verification voltage may include a pre-verification voltage Vvfyp and a main verification voltage Vvfym. Here, the main verification voltage Vvfym may be a verification voltage corresponding to a target state of the data program operation, and the pre-verification voltage Vvfyp has a level lower than the main verification voltage Vvfym. In the verification operation, the pre-verification voltage Vvfyp can be used for checking a degree to which the data program operation is performed on a non-volatile memory cell. When it is checked by the verification operation using the main verification voltage Vvfym that a threshold voltage of the non-volatile memory cell is changed with the program state P, the non-volatile memory cell does not need to be programmed further by a next program pulse. Also, when a threshold voltage of the non-volatile memory cell is lower than the pre-verification voltage Vvfyp, the non-volatile memory cell may be programmed by the next program pulse. If the threshold voltage of the non-volatile memory cell is in a range between the pre-verification voltage Vvfyp and the main verification voltage Vvfym, the non-volatile memory cell could be programmed too much (e.g., the threshold voltage of the non-volatile memory cell may rise too much, i.e., overprogramming) when normally programmed by the next program pulse. Thus, the memory device 150 could reduce an amount of change in the threshold voltage. In this case, the memory device 150 may control or adjust the degree to which the non-volatile memory cell is programmed (e.g., the amount of change in the threshold voltage) while the next program pulse is applied.

Referring to FIG. 6, when a plurality of non-volatile memory cells is programmed by a program pulse and then a verification operation is performed using the pre-verification voltage Vvfyp and the main verification voltage Vvfym, the plurality of non-volatile memory cells can be in three different states MC1, MC2, MC3. For a non-volatile memory cell having a first state MC1 lower than the pre-verification voltage Vvfyp, the memory device 150 may apply a next program pulse to induce a change of threshold voltage of the corresponding memory cell by an amount or a shift corresponding to the next program pulse. Such a general program mode (PGM Mode) may be referred to as a first program mode. On the other hand, if a non-volatile memory cell has a third state MC3 higher than the main verification voltage Vvfym, the memory device 150 avoids the non-volatile memory cell from being further programmed by the next program pulse because the threshold voltage of the non-volatile memory cell has already reached the program state P. Herein, inhibiting the non-volatile memory cell from additionally programming may be referred to as a program inhibit mode. Further, when the non-volatile memory cell is in a second state MC2, a threshold voltage of the non-volatile memory cell may rise too much when the non-volatile memory cell is programmed in the first program mode (PGM mode). Thus, when the next program pulse is applied to the non-volatile memory cell in the second program mode (DPGM mode), a change amount of the threshold voltage may be smaller than the amount caused in the first program mode (PGM mode).

A degree to which the non-volatile memory cell is programmed (e.g., an amount of change in threshold voltage) may be determined based on a time for which the program pulse is applied, the number of times the program pulse is applied, and a potential difference between the program pulses. Although a single program pulse is applied to plural non-volatile memory cells connected to a single word line, the memory device 150 can change or adjust a threshold voltage change amount of each of the non-volatile memory cells connected to the single word line. For changing threshold voltages of the plural non-volatile memory cells by different amounts, the memory device 150 can change or adjust potentials of bit lines connected to the respective non-volatile memory cells connected to the single word line.

For example, during a period in which a program pulse is applied to the word line, a ground voltage is applied to a first bit line connected to a first memory cell of which threshold voltage is in the first state MC1, a program adjustment voltage higher than the ground voltage is applied to a second bit line connected to a second memory cell of which threshold voltage is in the second state MC2 and a program inhibit voltage higher than the program adjustment voltage is applied to a third bit line coupled to the third memory cell having the third state MC3. In this case, there are potential differences between the word line and the respective first to third bit lines. As a potential difference between a word line and a bit line connected to a non-volatile memory cell is lesser, a change amount of the threshold voltage of the non-volatile memory cell caused by the program pulse may be smaller. Further, when the potential difference between the word line and the bit line is lower than a preset level, the non-volatile memory cell would be not programmed. Because the potential difference of the second memory cell having the second state MC2 is smaller than that of the first memory cell having the first state MC1, a degree to which the second memory cell is programmed by the next program pulse can be lesser than the degree of the first memory cell. Further, when the next program pulse is applied to the third memory cell and thus the potential difference between the program pulse and the program inhibit voltage applied to the third memory cell having the third state MC3 is lower than the preset level, the third memory cell having the third state MC3 might not be programmed further despite the next program pulse.

Referring to FIG. 6, the program mode may be determined according to a verification result corresponding to a program operation performed on the non-volatile memory cell. The program mode may include the first program mode (PGM Mode), the second program mode (DPGM Mode), and the third program mode (PGM Inhibit Mode). For example, a verify pass may indicate that a non-volatile memory cell is read as an off cell in response to a verification voltage. A verify fail may indicate that the non-volatile memory cell is read as an on cell in response to the verification voltage. In other words, if a threshold voltage of the non-volatile memory cell is lower than a verification voltage, the non-volatile memory cell is read as the on cell. But, if the threshold voltage is equal to, or higher than, the verification voltage, the non-volatile memory cell is read as the off cell.

Referring to FIG. 6, a non-volatile memory cell in which the program mode is the first program mode (PGM Mode) may be read as the on cell by both the pre verify voltage Vvfyp and the main verify voltage Vvfym. Another non-volatile memory cell in which the program mode is the second program mode (DPGM Mode) is read as the off cell by the pre-verification voltage Vvfyp and read as the on-cell by the main verify voltage Vvfym. Another non-volatile memory cell in which the program mode is the third program mode (PGM Inhibit Mode) may be read as the off cell by both the pre verify voltage Vvfyp and the main verify voltage Vvfym. Furthermore, because the pre-verification voltage Vvfyp has a smaller level than that of the main verification voltage Vvfym, there is no case when a non-volatile memory cell is read as the on cell by the pre-verification voltage Vvfyp and read as the off cell by the main verification voltage Vvfym.

Figure 7:
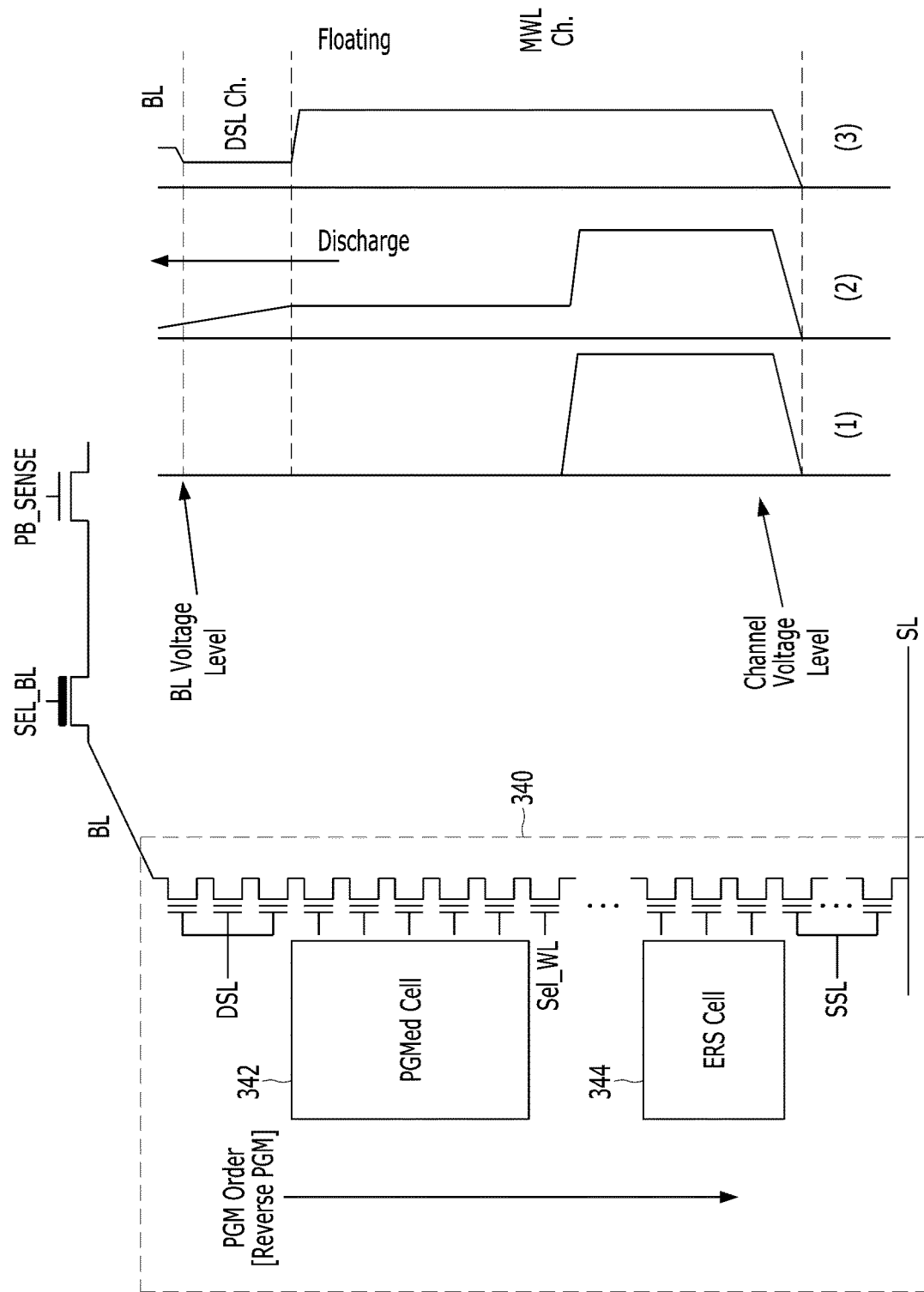
FIG. 7 illustrates discharge of a string and a bit line during a program operation according to an embodiment of the present disclosure.

FIG. 7 illustrates discharge of a string and a bit line during a program operation according to an embodiment of the present disclosure.

Referring to FIG. 7, the memory device 150 can include a string 340 including a plurality of non-volatile memory cells. The string 340 can include a first transistor, connected to a bit line BL, for operating in response to a first control voltage applied through the drain select line DSL, a second transistor, connected to a source line SL, for operating in response to a second control voltage applied through a string select line SSL, and at least one non-volatile memory cell connected between the first and second transistors. The at least one non-volatile memory cell can be programmed by a program pulse applied through a word line. The source line SL shown in FIG. 7 may correspond to the common source line CSL described with reference to FIG. 1, the first transistor may correspond to the drain select transistor DST, and the second transistor may correspond to the string select transistor SST. According to an embodiment, the first transistor and/or the second transistor may be individually implemented as a plurality of transistors connected in series with each other.

As a storage capacity of the memory device 150 increases, the number of non-volatile memory cells serially connected between the first transistor and the second transistor may increase. Referring to FIG. 7, multi-bit data can be sequentially programmed in a preset order (PGM Order) from a non-volatile memory cell connected to the first transistor to another non-volatile memory cell connected to the second transistor. The plurality of non-volatile memory cells included in the string 340 can be divided into a programmed non-volatile memory cell 342 having a programmed state (P, see FIG. 6) and an erased non-volatile memory cell 344 in which data is erased to maintain an erased state (E, see FIG. 6). When a next program operation is performed, a program pulse may be applied to a selected word line Sel_WL connected to the non-volatile memory cell located next to the programmed nonvolatile memory cell 342.

A program pulse may be applied to the selected word line Sel_WL to selectively program data in non-volatile memory cells connected to the selected word line Sel_WL. After a program pulse is applied, it is necessary to remove charges remaining in the string 340 for performing a verification operation corresponding to the program pulse or a next program operation corresponding to a next program pulse. In order to discharge the bit line BL connected to the string 340, the first transistor operated by the first control voltage applied through the drain select line DSL can be turned on. When a program pulse is applied to the selected word line Sel_WL, a pass voltage Vpass may be applied to a word line connected to the programmed non-volatile memory cell 342 to reduce resistance. When the resistance of a channel (DSL Ch., MWL Ch.) is reduced, discharge may occur quickly in the channel (DSL Ch., MWL Ch.) of the string 340.

As the program operations are repeatedly performed, a threshold voltage of the first transistor operated by the first control voltage applied through the drain select line DSL may continue to increase. In this case, the first control voltage applied through the drain select line DSL may be changed to be higher than a preset voltage in order to turn on the first transistor but reduce a resistance of the first transistor so that the string 340 could be discharged more quickly. When the first control voltage applied through the drain select line DSL for the discharge is over-voltage driving (OVD), the memory device 150 can perform program operations on the memory cells in the first, second, or third program mode corresponding to the program pulse described in FIG. 6 faster than operations when the first control voltage is not over-voltage driving. Through this procedure, a program operation speed of the memory device 150 may be improved.

In FIG. 7, in response to the operation of the first transistor operated by the first control voltage applied through the drain select line DSL during the data program operation, there are three cases: a first state (1) in which charges are accumulated in a channel of the string 340; a second state (2) in which undischarged charges remain in the channel of the string 340; and a third state (3) in which charges could be discharged when the channel of the string 340 is floating. How the three states described can occur during the data program operation will be described in more detail with reference to FIG. 8.

Figure 8:
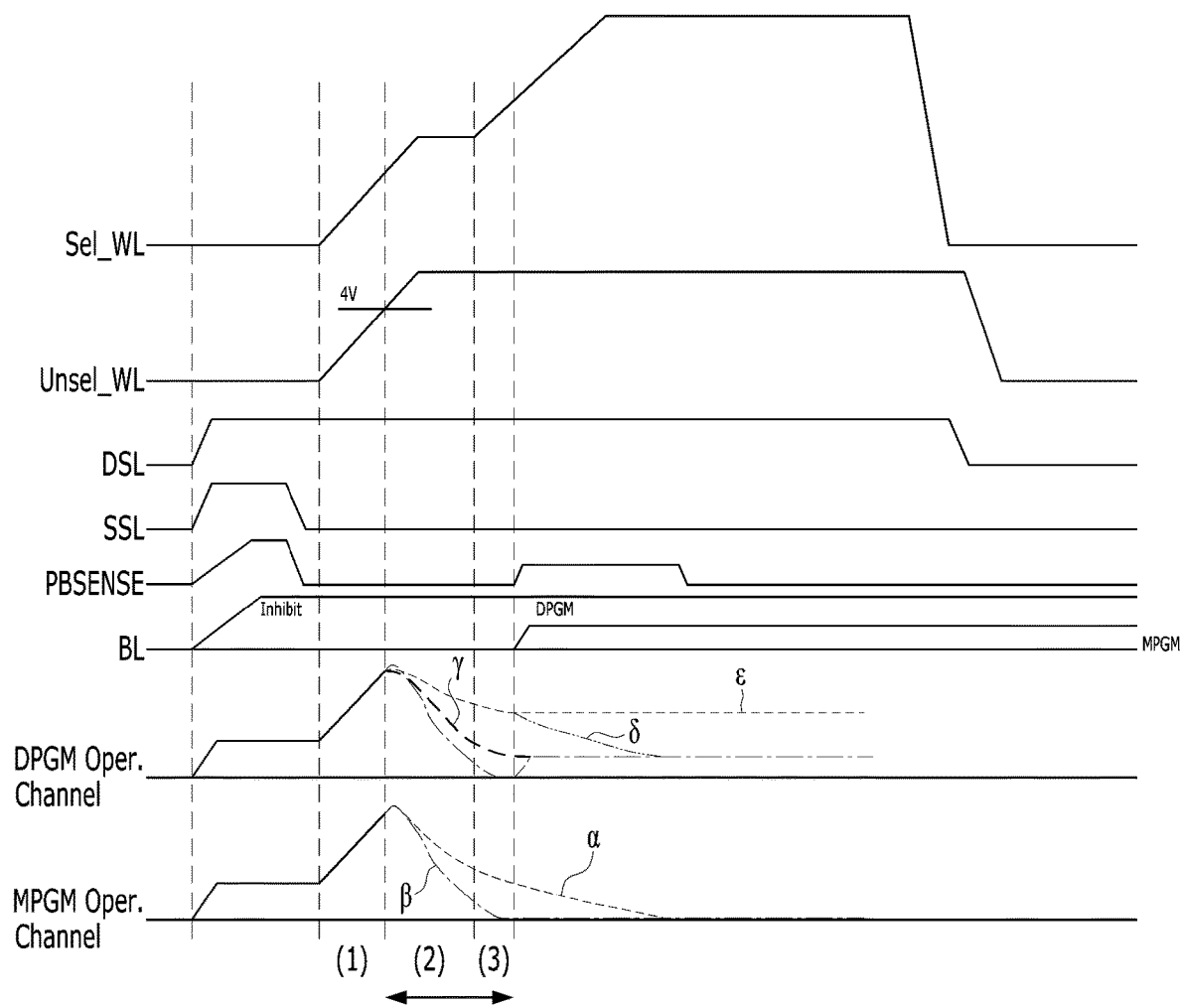
FIG. 8 illustrates a program operation that may vary according to discharge of a string and a bit line according to an embodiment of the present disclosure.

FIG. 8 illustrates a program operation that may vary according to discharge of a string and a bit line according to an embodiment of the present disclosure. Specifically, FIG. 8 illustrates the discharge of the channel of the string 340 through a first transistor operated by a first control voltage applied through a drain select line DSL before or while a program pulse is applied during a data program operation.

Referring to FIG. 8, when a program pulse is applied to the selected word line Sel_WL, a pass voltage may be applied to the unselected word line Unsel_WL. Before the program pulse is applied, the first control voltage and the second control voltage may be applied to the drain select line DSL and the string select line SSL, individually. Thereafter, when a page buffer control signal PBSENSE is activated, a potential of each bit line BL may be maintained differently. As described with reference to FIG. 6, the page buffer control signal PBSENSE may be activated in response to one of three program modes. For example, when a program mode regarding a non-volatile memory cell is the first program mode (PGM mode, general PGM mode, MPGM), a bit line connected the non-volatile memory cell is maintained at the ground voltage. In a case when the program mode is the third mode (PGM Inhibit mode), the potential of the bit line can be increased by a program inhibit voltage. When the program mode of the non-volatile memory cell is the second mode (DPGM), the potential of the bit line may be increased with a time difference. In order to reduce a degree to which data is programmed in the nonvolatile memory cell, the potential of the bit line is changed while the program pulse is applied. After the program pulse is applied, the second control voltage applied through the string selection line SSL may be deactivated.

While a data program operation is performed on a plurality of non-volatile memory cells 342 included in the string 340, a threshold voltage of the first transistor operated by the first control voltage applied through the drain select line DSL may increase. When a level of the pass voltage applied to the unselected word line Unsel_WL exceeds a specific potential (e.g., 4V) after the program pulse is applied, remaining charges of the channel in the string 340 may be discharged. Because discharge does not occur before the level of the pass voltage exceeds the specific potential, a potential of the channel (DPGM Oper. Channel, MPGM Oper. Channel) in the string 340 may continue to increase. In order to clearly distinguish programming degrees of the first program mode and the second program mode from each other (e.g., change amounts in threshold voltage through the first program mode and the second program mode), discharging a potential of the channel (DPGM Oper. Channel, MPGM Oper. Channel) in the string 340 might be required. However, because discharge does not occur before the potential of the pass voltage exceeds the specific potential, when the threshold voltage of the first transistor increases, it could be difficult to discharge the potential of the channel (DPGM Oper. Channel, MPGM Oper. Channel) in the string 340 so that a time for discharging the potential may not be sufficient.

In FIG. 8, various cases ($\alpha, \beta, \gamma, \delta, \epsilon$) according to a discharge rate of the channel potentials (DPGM Oper. Channel, MPGM Oper. Channel) in the string 340 will be described as examples. In a first case ($\alpha$), a potential of the channel (MPGM Oper. Channel) in the string 340 including a non-volatile memory cell is slowly discharged when the corresponding non-volatile memory cell is programmed in the first program mode. But, in a second case (13), the potential of the channel (MPGM Oper. Channel) in the string 340 including a non-volatile memory cell is rapidly discharged when the corresponding non-volatile memory cell is programmed in the first program mode. In addition, when a non-volatile memory cell is programmed in the second program mode, a potential of the channel (DPGM Oper. Channel) in the string 340 including the non-volatile memory cell is rapidly discharged in a third case (γ) or slowly discharged in fourth and fifth cases (δ, ε). Although it may be desirable to discharge a channel potential (DPGM Oper. Channel, MPGM Oper. Channel) so that a potential of the channel corresponds to the ground voltage, a program operation can be successfully performed on a memory cell in the second program mode when the potential of the channel is lower than a potential of the bit line BL which is raised by the page buffer control signal PBSENSE.

In the first case (α) when a channel potential (MPGM Oper. Channel) of the string 340 is slowly discharged while a program operation is performed on a memory cell in the first program mode, the fourth case (δ) when the channel potential (DPGM Oper. Channel) of the string 340 is slowly discharged while a program operation is performed on a memory cell in the second program mode, or a fifth case (ε) when the channel (DPGM Oper. Channel) of the string 340 is floated by a threshold voltage of the transistor connected to the drain select line DSL, it might be difficult to adjust or change a potential of the bit line BL to control a degree to which the non-volatile memory cell is programmed (e.g., an amount of change in threshold voltage). When the potential of the bit line BL would not be sufficiently discharged, a degree to which the non-volatile memory cell is programmed is lower than a preset level or a preset amount. Even though the non-volatile memory cell is actually in the first program mode or the second program mode, the non-volatile memory cell may be erroneously determined to be in the third program mode (i.e., PGM Inhibit mode). In this case, because the non-volatile memory cell is not sufficiently programmed, the memory device 150 can determine that the corresponding non-volatile memory cell is a bad memory cell even though the corresponding non-volatile memory cell is healthy.

According to an embodiment of the present disclosure, when the memory device 150 overdrives a level of the first control voltage applied through the drain select line DSL, a discharge issue can be resolved. Even though a threshold voltage of the first transistor operated by the first control voltage applied through the drain select line DSL can unintentionally increase during a program operation performed to the plurality of non-volatile memory cells 342, over-voltage driving of the first control voltage could avoid a slow discharge. However, when a potential difference between the first control voltage and the increased threshold voltage of the first transistor is lower than a potential of the bit line BL, the potential of the bit line BL coupled to a memory cell which is to be programmed in the second program mode could be increased before the channel of the string 340 is not completely discharged. In this case, the memory cell might not be successfully programmed in the second program mode because the channel is floating which is described with reference to FIG. 7.

As a storage capacity of the memory device 150 increases, the number of serially connected non-volatile memory cells included in the string 340 may increase. As the number of non-volatile memory cells is greater, the number of program operations performed in the string 340 can be greater. Accordingly, it might be plausible that the threshold voltage of the first transistor included in the string 340 may increase according to the number of program operations. To improve a program operation, the memory device 150 according to an embodiment of the present disclosure can control or change a level of the first control voltage applied through the drain select line DSL in response to the number of times the program pulse is applied from the string 340.

Figure 9:
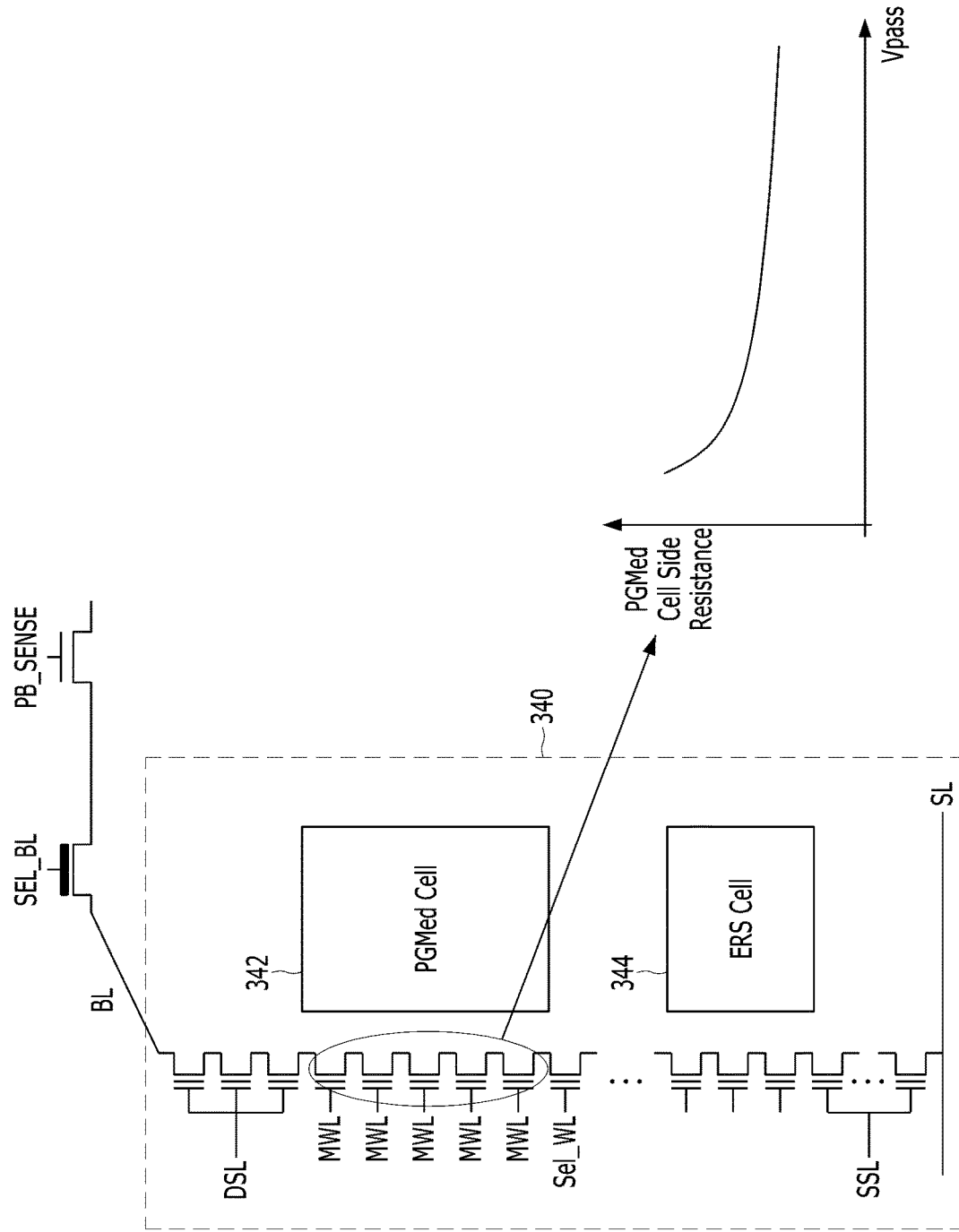
FIG. 9 illustrates a method for controlling discharge of strings and bit lines according to an embodiment of the present disclosure.

FIG. 9 illustrates a method for controlling discharge of strings and bit lines according to an embodiment of the present disclosure.

Specifically, FIG. 9 describes a resistance change of the programmed non-volatile memory cell 342 in the string as well as a resistance change of the first transistor, for a data program operation of the non-volatile memory cell connected to the selected word line Sel_WL. Herein, the resistance change of the programmed non-volatile memory cell 342 can be varied based on a level of a pass voltage Vpass applied to multiple word lines MWL connected to the programmed non-volatile memory cell 342. The resistance change of the first transistor can be varied according to a level of the first control voltage applied through the drain select line DSL.

Referring to FIG. 9, as a level of the pass voltage increases, the resistance of the programmed non-volatile memory cell 342 could be decreased. Also, as a level of the first control voltage applied through the drain select line DSL increases, the resistance of the first transistor may be decreased. Accordingly, when a level of the pass voltage applied through at least one unselected word lines coupled to non-volatile memory cells which have been programmed is increased, charges of the channel in the string 340 can be discharged sufficiently during a preset operation margin. During a data program operation, the preset operation margin for discharge could be reduced so that a program operation can get faster.

Figure 10:
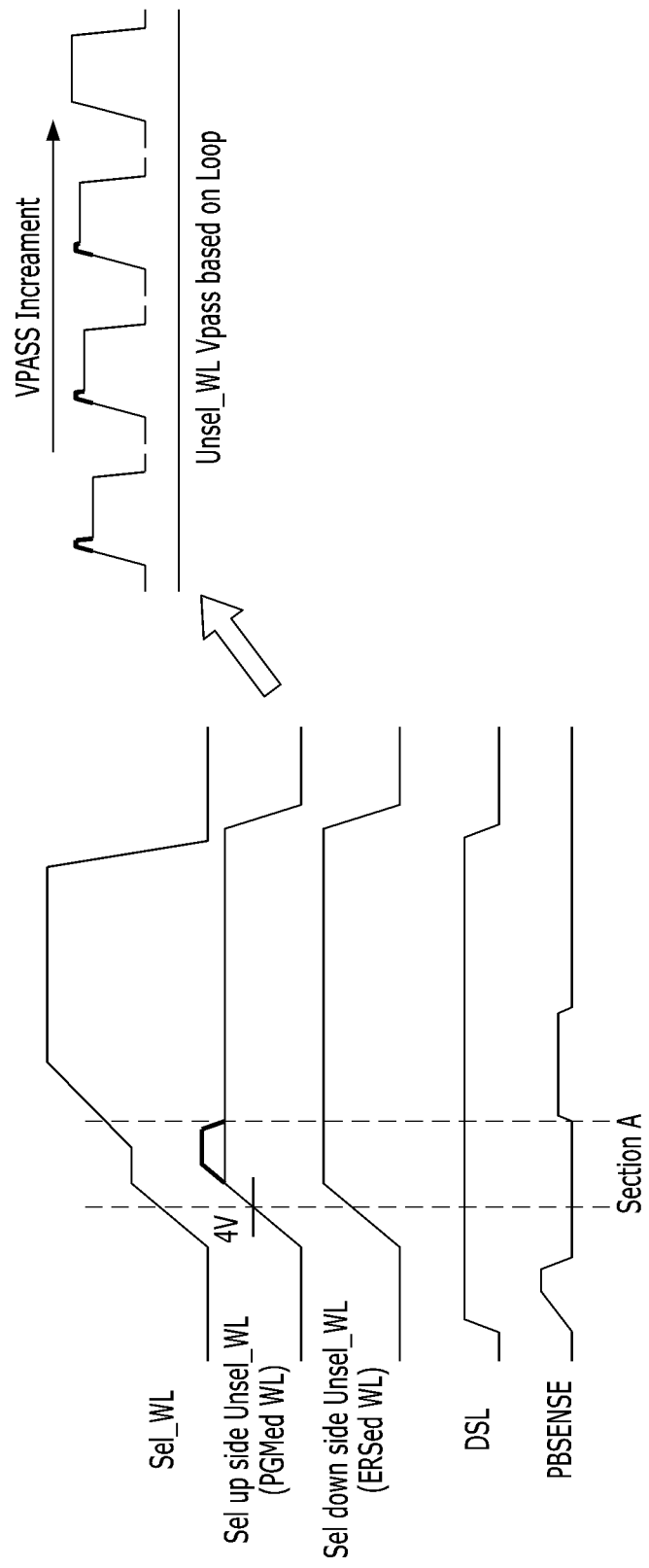
FIG. 10 illustrates a program operation based on a level change of a pass voltage according to an embodiment of the present disclosure.

FIG. 10 illustrates a program operation based on a level change of a pass voltage according to an embodiment of the present disclosure.

Referring to FIG. 10, the memory device 150 can adjust or change a level of the pass voltage in order to rapidly discharge charges remaining in the channel of the string 340. According to an embodiment, the memory device 150 can apply pass voltages having different levels to the string 340 through different word lines.

Referring to FIGS. 9 and 10, the string 340 can include a non-volatile memory cell in which data is programmed according to a data program operation. The non-volatile memory cell can be connected to a selected word line Sel_WL. The string 340 can include two groups. One group includes at least one non-volatile memory cell 342 in which data has been programmed, and the other group includes at least one non-volatile memory cell 344 in which data has been erased (i.e., the at least one non-volatile memory cell 344 being in an erased state). In a case when data is programmed into the string 340 for the first time, the string can include no non-volatile memory cell 342 in which data is programmed. In another case when data is programmed last in the string 340, no non-volatile memory cells 344, which is in the erased state, can be included in the string 340. Different levels of pass voltages Vpass may be applied to a first word line (Sel up side Unsel_WL, PGMed WL) connected to the non-volatile memory cell 342 in which data has been programmed and a second word line (Sel down side Unsel_WL, ERSed WL) connected to the non-volatile memory cell 344 in which no data has been programmed.

During a data program operation, when a program pulse is applied to the selected word line Sel_WL, a pass voltage Vpass may be applied to unselected word lines (e.g., the first word line and the second word line). For example, the memory device 150 can apply a pass voltage Vpass having a preset first level to the second word line. On the other hand, the memory device 150 can apply a pass voltage Vpass having a second level higher than the first level to the first word line. Referring to FIG. 10, the pass voltage Vpass applied to the first word line can have the second level higher than the first level in a section A. Here, the section A is a time amount or a time gap between first and second timing points. The first timing point is when the program pulse and pass voltage are applied to the selected and unselected word lines and the pass voltage rises to the first level. The second timing point is when a potential of a bit line is increased by a page buffer control signal PBSENSE which is activated to reduce a degree to which the threshold voltage of the non-volatile memory cell coupled to the selected word line and in the second program mode (DPGM) rises. The section A can be considered to be a marginal time taken for discharging the channel in the string 340. After the section A, data may be differently programmed into the non-volatile memory cell coupled to the selected word line according to the first program mode MPGM or the second program mode DPGM of the non-volatile memory cell coupled to the selected word line.

According to an embodiment, the memory device 150 may increase the level of the pass voltage, as the number of times the program pulse is applied increases (VPASS Increment). Further, the memory device 150 may adjust the level of the pass voltage according to an operating environment (such as a temperature inside the memory device 150). For example, according to an embodiment, a range of the second level higher than the first level of the pass voltage Vpass applied to the first word line can be determined based on an operating environment (e.g., a temperature). Also, a maximum value to which the second level of the pass voltage Vpass can increase can be determined in response to operating characteristics of the non-volatile memory cell included in the memory device 150.

According to an embodiment, referring to FIG. 10, as the number of times the program pulse is applied increases, a difference between the first level and the second level of the pass voltage Vpass applied to the first word line can decrease. Because the second level is determined based on the operating environment (e.g., a temperature) of the memory device 150, the memory device 150 might not change or adjust the second level, but increase the first level, as the number of times the program pulse is applied increases.

Figure 11:
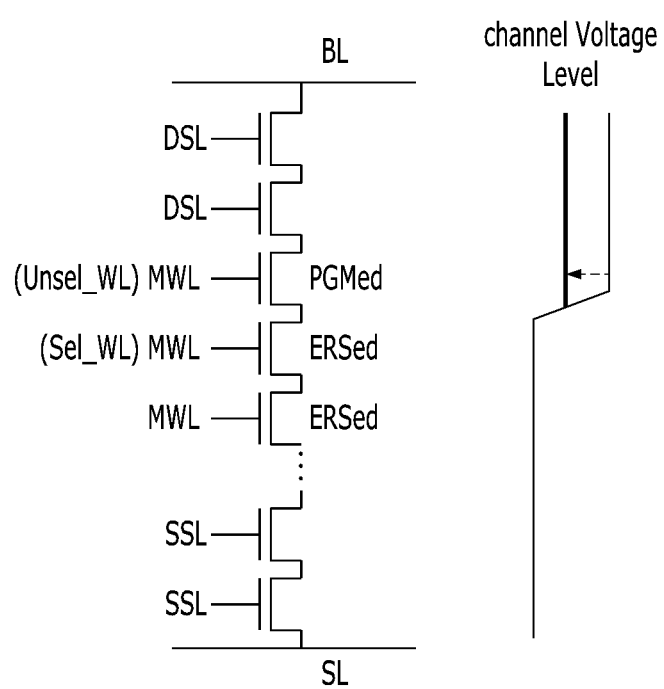
FIG. 11 illustrates an operation state based on the pass voltage shown in FIG. 10 according to an embodiment of the present disclosure.

FIG. 11 illustrates an operation state based on the pass voltage shown in FIG. 10 according to an embodiment of the present disclosure.

Referring to FIG. 11, a plurality of nonvolatile memory cells included in a string in the memory device 150 can be programmed with data in an order of non-volatile memory cells connected to a drain select line (DSL) to a source select line (SSL). Before any non-volatile memory cell is not programmed, a string included in a free block can have no programmed non-volatile memory cells. After data is programmed in a first non-volatile memory cell connected to the drain select line (DSL) among the plurality of nonvolatile memory cells, the first non-volatile memory cell is in a programmed state PGMed, but other non-volatile memory cells in the string can be in an erased state ERSed.

As described in FIG. 10, a word line Sel_WL can be selected for programming a second non-volatile memory cell of the string. Referring to FIG. 9, while the second non-volatile memory cell is programmed, a resistance of the programmed non-volatile memory cell 342 which is in the programmed state PGMed can be reduced when a level of the pass voltage Vpass, applied to an unselected word line Unsel_WL connected to the first non-volatile memory cell in which the data is programmed, is increased. This operation can speed up discharging of the remaining charges of the channel in the string, so that a channel voltage level may be lowered from the second non-volatile memory cell, connected to the selected word line Sel_WL to which a program pulse is applied, to the bit line BL. Accordingly, referring to FIG. 8, a potential of the channel in the string can be quickly lowered before a program operation is performed on a memory cell in a second program mode DPGM. This operation can improve a speed of the data program operation.

Figure 12:
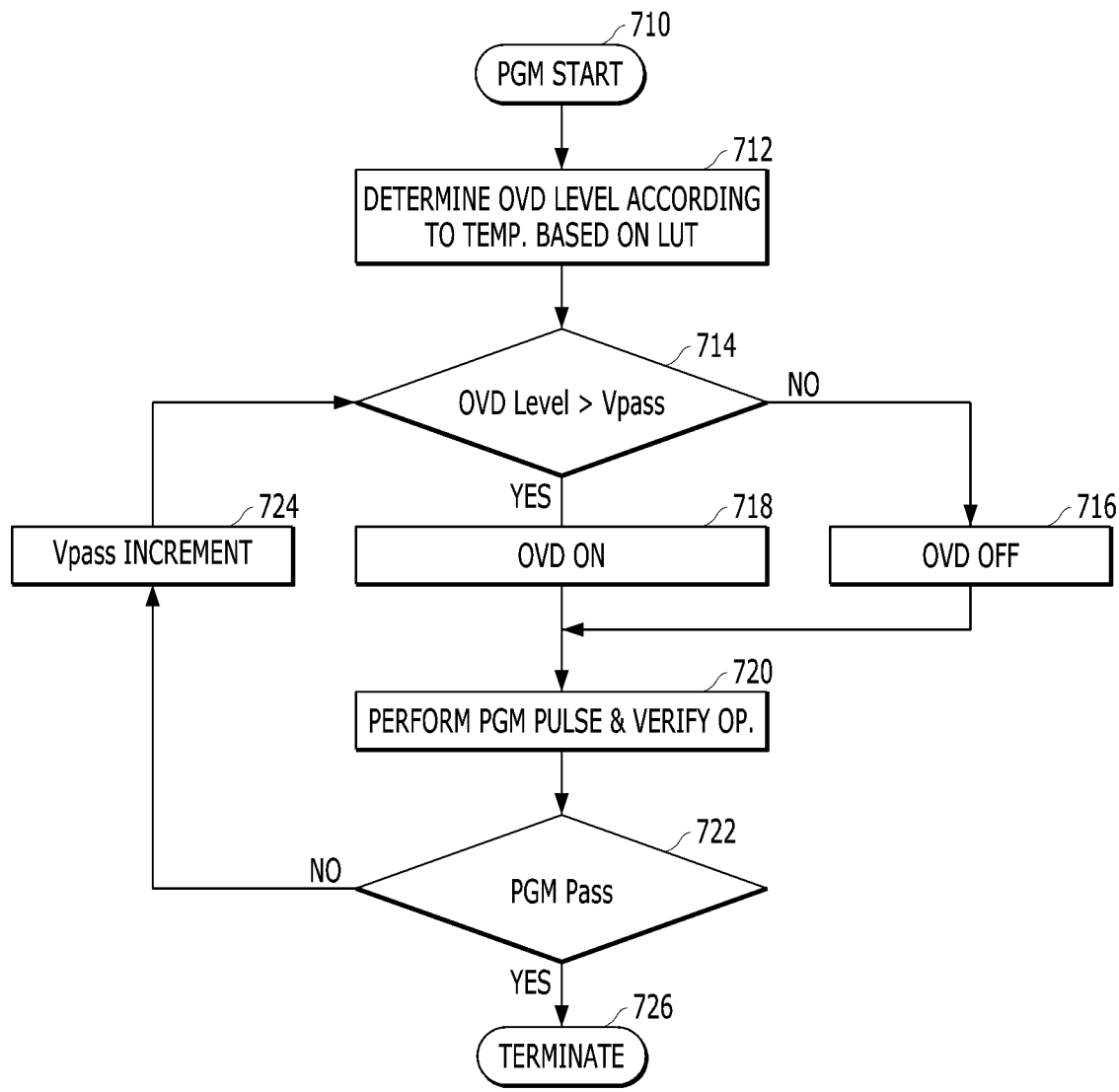
FIG. 12 illustrates a method for operating a memory device according to an embodiment of the present disclosure.

FIG. 12 illustrates a method for operating a memory device according to an embodiment of the present disclosure.

Referring to FIG. 12, a data program operation may be started when the memory device 150 receives a program command and program data transferred from the controller 130 (operation 710). The data program operation can be terminated (operation 726) when it is determined that the program data has been programmed in the non-volatile memory cells (Yes of operation 722). Herein, the data program operation can be performed through the ISPP operation. A plurality of program pulses can be applied to program data into the non-volatile memory cell, and a verification operation can be performed after a program pulse is applied. A program operation applying a program pulse and a verification operation corresponding to the applied program pulse can be considered as a single loop or cycle.

When the data program operation is started, the memory device 150 may determine how much higher than a preset level to drive the pass voltage Vpass applied to at least one unselected word line in response to an operating environment (e.g., a temperature) (operation 712). For example, how the memory device 150 is driven to a higher level (e.g., the second level) than an initial value and/or a preset level (e.g., the first level) of the pass voltage Vpass can be determined by referring to a table described with reference to FIG. 13.

When the memory device 150 determines that the second level (OVD Level) of the pass voltage Vpass is greater than the first level Vpass (YES of operation 714), the memory device 150 can activate a circuit for over-driving the pass voltage Vpass (operation 718). But, if the memory device 150 determines that the second level (OVD Level) of the pass voltage Vpass is equal to or smaller than the first level Vpass (No of operation 714), the memory device 150 might not activate the circuit for over-driving the pass voltage Vpass (operation 716). Through these procedures, as described with reference to FIG. 10, the memory device 150 may change and adjust a level of the pass voltage Vpass.

When a level of the pass voltage Vpass applied to the at least one unselected word line (e.g., whether to over-drive the pass voltage Vpass) is determined (operation 718 or 716), the memory device 150 can perform a program operation applying a program pulse to a non-volatile memory cell coupled to the selected word line and a verification operation corresponding to the program pulse (operation 720). For example, the program operation applying a program pulse and the verification operation corresponding to the program pulse can be performed based on the ISPP operation and one selected from the plurality of program modes described with reference to FIGS. 3 to 6.

After performing the program operation applying to a program pulse, the memory device 150 can terminate the data program operation (operation 726) if it is determined that data has been programmed into the non-volatile memory cell according to a result of the verification operation corresponding to the program pulse (YES of operation 722). Conversely, if it is determined that data has not been programmed into the non-volatile memory cell according to the result of the verification operation performed after the program operation applying to the program pulse is performed (No of operation 722), the memory device 150 can perform a next program operation. The first level of the pass voltage Vpass corresponding to a next program pulse can be increased (operation 724), referring to FIG. 10. According to an embodiment, the first level of the pass voltage Vpass can be gradually increased each time in response to the number of times the program pulse is applied or can be increased in a stepped pattern (e.g., increased once every predetermined number of times). Thereafter, the memory device 150 can compare the second level (OVD Level) of the pass voltage Vpass with the first level Vpass (operation 714).

Figure 13:
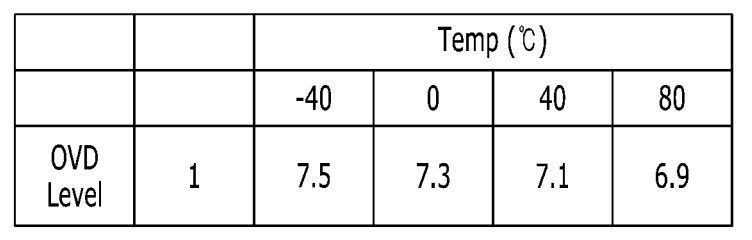

FIG. 13 illustrates a table used for determining a level of pass voltage according to an embodiment of the present disclosure. Some of numerical values shown in FIG. 13 may show a ratio rather than an absolute value. An embodiment of the present disclosure might not be limited by the numerical values shown in FIG. 13 because those values can be changed depending on characteristics of the memory device 150.

According to an embodiment, the control circuit 180 or the voltage supply circuit 170 described with reference to FIG. 1 can determine a level of the pass voltage Vpass applied through at least one unselected word line Unsel_WL based on the table described with reference to FIG. 13.

Referring to FIG. 13, the table can store various second levels of the pass voltage Vpass. For example, the pass voltage Vpass applied through the unselected word line Unsel_WL in the string 340 may be 7.5 V at 40 degrees below zero and 7.1 V at 40 degrees above zero. Moreover, according to an embodiment, the table can store increments of the pass voltage Vpass (e.g., a difference between the first level and the second level) according to an operating environment of the memory device 150 (e.g., an internal temperature), or a ratio for over-voltage driving the pass voltage Vpass.

Referring to FIGS. 12 and 13, before the memory device 150 applies a program pulse to a selected word line for programming data in a non-volatile memory cell coupled to the selected word line and in the first program mode or the second program mode, the memory device 150 can increase a level of the pass voltage Vpass applied through an unselected word line Unsel_WL, so that a discharge rate of the charges of the channel in the string 340 could be speeded up. In response to a program pulse supplied through the selected word line Sel_WL in the string 340, the memory device 150 can precisely control a degree to which the non-volatile memory cell in the first program mode or the second program mode is programmed in response to a program pulse. The program operation can be performed more accurately on the non-volatile memory cell in the first program mode and the second program mode, as discussed with reference to FIG. 8.

Figure 14:
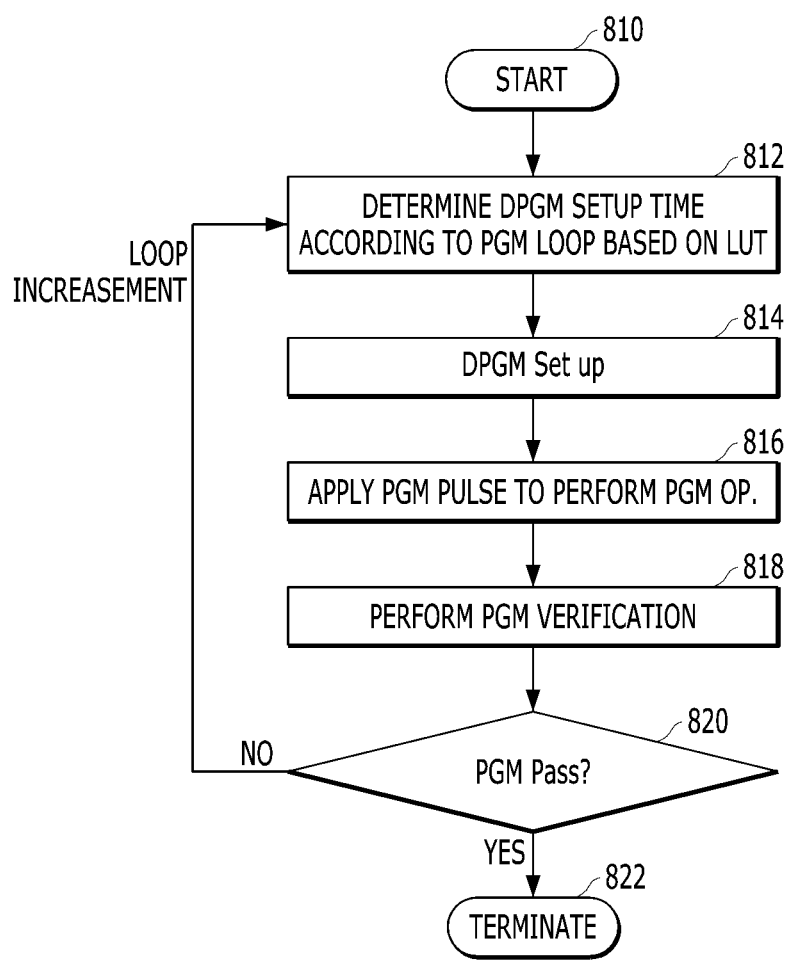
FIG. 14 illustrates an embodiment of a method for operating a memory device.

FIG. 14 illustrates an embodiment of a method for operating a memory device which can include starting a program operation (810), checking information regarding a setup time according to a current loop to which a program pulse is applied during a data program operation (812), setting or changing a potential of the bit line BL based on a program mode (e.g., the second program mode, DPGM) (814), applying a program pulse to program data in a non-volatile memory cell (816), verifying a program result corresponding to the program pulse (818), determining whether to terminate the data program operation according to a verification result (820), and terminating the data program operation (822) when it is determined that the data has been programmed (YES of the operation 820).

The memory device 150 can store data or information regarding adjusting or changing a setup time during a program operation in a register or the like. Referring back to FIG. 10, the setup time may indicate an operation period between a timing of applying a program pulse and a pass voltage and a timing of adjusting or changing the potential of the bit line. The information regarding the setup time will be described later with reference to FIG. 16.

Referring back to FIG. 5, a data program operation may be performed by applying a plurality of program pulses to a non-volatile memory cell. After the program pulse is applied, data programmed in the non-volatile memory cell in response to the program pulse can be verified. Referring back to FIG. 6, according to a verification result, the memory device 150 can determine a program mode performed to the non-volatile memory cell for a next loop to which a next program pulse is applied. Referring back to FIG. 8, when a program loop starts, the bit line BL is maintained as a ground voltage for programming data in the non-volatile memory cell (e.g., increasing a threshold voltage of the non-volatile memory cell). But, if data is not programmed in the non-volatile memory cell (e.g., it is unnecessary to increase a threshold voltage of the non-volatile memory cell), the memory device 150 can perform the program inhibit mode by raising a potential of the bit line BL to a preset level.

The memory device 150 may perform two different program modes when increasing a threshold voltage of the non-volatile memory cell. In the first program mode (PGM, MPGM), the memory device 150 may maintain the potential of the bit line BL as a ground voltage. On the other hand, in the second program mode (DPGM), the memory device 150 can adjust or change the potential of the bit line BL at a timing while the program pulse is applied.

According to an embodiment, the memory device 150 can check a loop up table (LUT) in which a setup time for adjusting and changing a potential of a bit line connected to a non-volatile memory cell is stored in response to a program loop (812), and change or adjust a potential of the bit line BL corresponding to the non-volatile memory cell to which the second program mode DPGM is to be performed in response to the setup time corresponding to the program loop (814). After determining a setup time for the second program mode DPGM (814), the memory device 150 can apply a program pulse to the non-volatile memory cell (816).

After performing a program operation corresponding to the program pulse (816), the memory device 150 can perform a verification operation corresponding to the program pulse (818). According to an embodiment, the program operation and the verification operation corresponding to the program pulse may be performed based on the ISPP operation and the plurality of program modes described with reference to FIGS. 3 to 6.

After applying the program pulse to perform the program operation, the memory device 150 can terminate the data program operation (822) if it is determined that data is programmed in the non-volatile memory cell according to a result of the verification operation (YES, of operation 820).

Conversely, if it is determined that data has not been programmed into the non-volatile memory cell according to the result of the verification operation performed after the program operation (No, of operation 820), the memory device 150 can go back to a next program loop. After increasing a program loop, the memory device 150 can check a table (Look Up Table) in which a set-up time for adjusting and changing a potential of a bit line connected to the non-volatile memory cell in response to the program loop (812).

Figure 15:
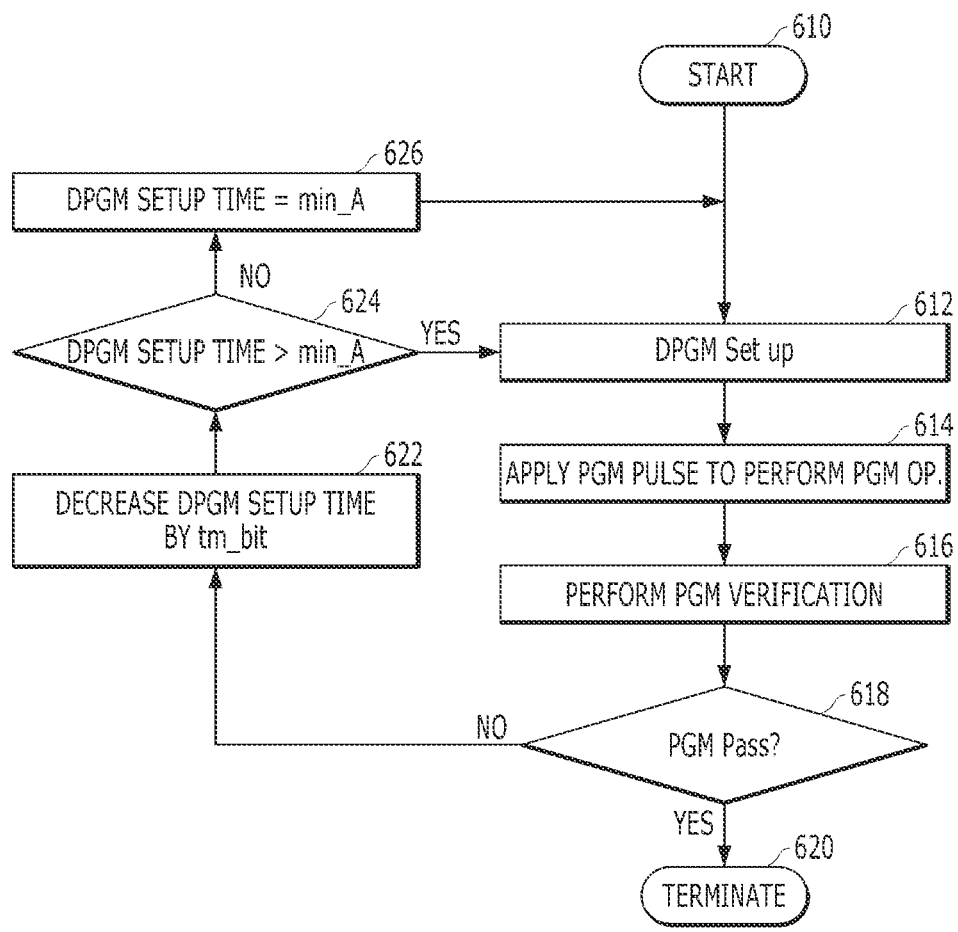
FIG. 15 illustrates an embodiment of a method for operating a memory device.

FIG. 15 illustrates an embodiment of a method for operating a memory device which can include starting a program operation (610), selecting a bit line BL whose potential is to be changed in response to a program mode (e.g., a second program mode, DPGM) (612), applying a program pulse to a non-volatile memory cell for programming data (614), verifying a program result (616), determining whether to terminate a program operation according to a verification result (618), and terminating the program operation (620) when it is determined that the data has been programmed in the non-volatile memory cell (YES of operation 618).

In some embodiments, if it is determined that the non-volatile memory cell data has not been programmed (No, of operation 618), the setup time for adjusting or changing the potential of the bit line connected to the non-volatile memory cell may be reduced by a preset time (622). After adjusting the setup time (622), the memory device 150 may check whether an adjusted setup time is greater than a minimum time min_A (624). Referring back to FIG. 8, the setup time for changing the potential of the bit line to perform the second program mode DPGM should not be shorter than the minimum time for discharging charges in the channel of the string 340. If the minimum time for discharging the charges in the channel of the string 340 is not guaranteed, the potential of the bit line may not be sufficiently lowered so that data might not be sufficiently programmed into the non-volatile memory cell as much as scheduled or planned.

If the adjusted setup time is greater than the minimum time min_A (YES, of operation 624), the memory device 150 can change the potential of the bit line BL corresponding to the program mode (e.g., the second program mode, DPGM) (612). If the adjusted setup time is equal to or less than the minimum time min_A (No, of operation 624), the memory device 150 may determine the adjusted setup time as the minimum time min_A (626). After setting the adjusted setup time as the minimum time min_A (626), the memory device 150 can change the potential of the bit line BL corresponding to the program mode (e.g., the second program mode, DPGM) (612).

Referring to FIGS. 14 and 15, the memory device 150 may determine a setup time for adjusting the potential of the bit line BL for the second program mode DPGM before applying the program pulse to the non-volatile memory cell. According to an embodiment, the setup time may be set to a value corresponding to an operating environment of the memory device 150 and the number of times (program loop) to which the program pulse is applied. Further, an initial value of the setup time could be reduced when a predetermined number of the program pulses are applied or whenever a program pulse is applied. According to an embodiment, the data or the information stored in a register in the memory device 150 may be differently set or established based on characteristics of the memory device 150. For example, the memory device 150 may store an initial value for the setup time and a change value that is decreased in response to at least one program loop.

FIG. 16 illustrates an example of a relationship between a setup time for changing a potential of the bit line, a program loop, and an operating environment, to perform the second program mode (DPGM). Numerical values shown in FIG. 16 are just examples and are not intended to limit the embodiments to these specific numerical values.

Referring to FIG. 16, the setup time may be set in response to a program loop and an operating environment (e.g., a temperature) of the memory device 150. For example, a setup time for controlling a program operation may be set in response to characteristics of a non-volatile memory cell included in the memory device 150.

According to an embodiment, as the program loop increases, the setup time for changing the potential of the bit line to perform the second program mode DPGM can be shortened. Also, as an operating temperature of the memory device 150 increases, the setup time for changing the potential of the bit line to perform the second program mode DPGM may be shortened. The memory device 150 can activate a page buffer signal PBSENSE in response to the setup time.

One or more embodiments include a semiconductor device that can divide non-volatile memory cells into three groups subjected to a normal program operation (MPGM), a double verify program (DPGM), and a program inhibit (PGM Inhibit) in response to a program-verification result during an incremental step pulse programming (ISPP) operation. After determining a program pulse applied based on a programmed state, the semiconductor device can change or adjust a control voltage level applied to a bit line select line or a drain select line (DSL) according to the program pulse and an operating environment, thereby reducing a time spent on discharging a bit line or a channel.

One or more additional embodiments include a semiconductor device which can change or adjust a setup time for adjusting a potential of a bit line based on a program mode, which is determined in response to a program-verification result, during an Incremental Step Pulse Programming (ISPP) operation. The program operation speed can be improved by adjusting or changing the setup time to adjust the potential of the bit line after determining a program pulse applied to the non-volatile memory cell.

One or more additional embodiments include a semiconductor device which can change or adjust a setup time for adjusting a potential of a bit line based on a program mode, which is determined in response to a program-verification result, during an Incremental Step Pulse Programming (ISPP) operation. The program operation speed can be improved by adjusting or changing the setup time to adjust the potential of the bit line after determining a program pulse applied to the non-volatile memory cell.

One or more additional embodiments include a semiconductor device which can determine which program mode is performed for program data to a non-volatile memory cell, among a normal program operation (MPGM), a double verify program (DPGM), and a program inhibit (PGM Inhibit), in response to a program-verification result during an incremental step pulse programming (ISPP) operation. For performing the double verify program to a non-volatile memory cell, the semiconductor device can reduce a setup time for adjusting a potential of a bit line coupled to the non-volatile memory cell after a program pulse is applied to a word line coupled to the non-volatile memory cell according to the number of times the program pulse is applied and an operation environment of the semiconductor device.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A memory device, comprising:
a memory structure including at least one non-volatile memory cell capable of storing multi-bit data; and
a control device configured to:
perform a program verification after a first program pulse is applied to the at least one non-volatile memory cell,
determine a program mode for the at least one non-volatile memory cell based on a result of the program verification, and
change a level of a pass voltage, which is applied to another non-volatile memory cell coupled to the at least one non-volatile memory cell, from a first level to a second level which is higher than the first level or a setup time for changing a potential of a bit line coupled to the at least one non-volatile memory cell, according to the program mode,
wherein the performing, the determining and the changing are performed during a data program operation of applying a plurality of program pulses to program multi-bit data to the at least one non-volatile memory cell.

2. The memory device according to claim 1, wherein the memory structure comprises:
a first transistor coupled between the at least one memory cell and a bit line and configured to operate in response to a first control voltage applied to the drain select line (DSL);
a second transistor coupled between the at least one memory cell and a source line and configured to operate in response to a second control voltage applied to a string select line (SSL); and
the at least one non-volatile memory cell coupled between the first transistor and the second transistor and configured to store the multi-bit data through the plurality of program pulses.

3. The memory device according to claim 2,
wherein the at least one non-volatile memory cell comprises N number of transistors serially connected to each other between the first transistor and the second transistor, and
wherein the control device programs the multi-bit data to the at least one non-volatile memory cell in an order from a transistor connected to the first transistor to another transistor connected to the second transistor among the N number of transistors.

4. The memory device according to claim 1,
wherein the control device is further configured to determine the level of the pass voltage in response to a temperature of the memory device, and
wherein the control device changes the level of the pass voltage from the first level to the second level by performing overvoltage driving.

5. The memory device according to claim 4, wherein the control device is further configured to maintain the second level until a potential of a bit line coupled to the at least one non-volatile memory cell is changed according to the program mode determined based on the result of the program verification.

6. The memory device according to claim 1, wherein the control device is further configured to apply the pass voltage having the first level to at least one other non-volatile memory cell which is in an erased state and apply the pass voltage having the second level to at least one other non-volatile memory cell which has been programmed.

7. The memory device according to claim 1, wherein the control device is further configured to increase the level of the pass voltage in response to a number of program pulses applied to the at least one non-volatile memory cell during the data program operation, and
wherein the setup time becomes shorter as a temperature of the memory device is higher.

8. The memory device according to claim 1,
wherein the control device determines the program mode corresponding to a second program pulse as one of a first mode, a second mode, and a third mode,
wherein the control device is further configured to apply, in the first mode, the second program pulse to the at least one non-volatile memory cell for changing or adjusting a threshold voltage of the at least one non-volatile memory cell by a first amount which is equal to or larger than an amount caused by the first program pulse,
wherein the control device is further configured to apply, in the second mode, the second program pulse to change or adjust the threshold voltage of the at least one non-volatile memory cell by a second amount which is smaller than the amount caused by the first program pulse, and
wherein the control device is further configured to apply, in the third mode, the second program pulse to the at least one non-volatile memory cell of which a change of the threshold voltage is inhibited.

9. The memory device according to claim 8, wherein the control device changes the level of the pass voltage when the program mode is the second mode, and
wherein the control device determines the setup time corresponding to each of the first mode, the second mode, and the third mode.

10. The memory device according to claim 1, wherein the setup time becomes shorter as a number of program pulses applied to the at least one non-volatile memory cell during the data program operation is greater.

11. A memory system, comprising:
a memory device including plural non-volatile memory cells; and
a controller configured to receive a write command and write data from a host, determine a location in which the write data is stored in the memory device, and transfer the write data to the memory device,
wherein the memory device is configured to:
determine a program mode which causes a change of threshold voltages of the plural non-volatile memory cells, and
change a level of a pass voltage, which is applied to other non-volatile memory cells coupled to the plural non-volatile memory cells, from a first level to a second level which is higher than the first level or a setup time for changing a potential of a bit line coupled to the at least one non-volatile memory cell, according to the program mode, and
wherein the determining and the changing are performed during a data program operation of applying a plurality of program pulses to program the write data to the plural non-volatile memory cells.

12. The memory system according to claim 11,
wherein the plural non-volatile memory cells in the memory device are coupled to each other via a single word line,
wherein each of the plural non-volatile memory cells is coupled to a different bit line, and
wherein the memory device further includes a string including:
a first transistor configured to operate in response to a first control voltage applied to a drain select line (DSL);
a second transistor configured to operate in response to a second control voltage applied to a string select line (SSL);
a non-volatile memory cell among the plural non-volatile memory cells; and
the other non-volatile memory cells coupled serially to the non-volatile memory cell between the first transistor and the second transistor, and
wherein the memory device programs multi-bit data in the string in an order from a memory cell connected to the first transistor to another memory cell connected to the second transistor of the string.

13. The memory system according to claim 12, wherein the memory device is further configured to apply the pass voltage having the first level to at least one non-volatile memory cell in an erased state between the second transistor and the one of the plural non-volatile memory cells and apply the pass voltage having the second level to at least one non-volatile memory cell which has been programmed between the first transistor and the one of the plural non-volatile memory cells.

14. The memory system according to claim 11,
wherein the memory device is further configured to determine the level of the pass voltage in response to a temperature of the memory device, and
wherein the memory device changes the first level to the second level by performing overvoltage driving.

15. The memory system according to claim 14, wherein the memory device is further configured to maintain the second level until a potential of a bit line coupled to the one of the plural non-volatile memory cells is changed according to the program mode determined based on the result of the program verification.

16. The memory system according to claim 11, wherein the memory device is further configured to apply the pass voltage having the first level to at least one another non-volatile memory cell which is in an erased state and apply the pass voltage having the second level to at least one another non-volatile memory cell which has been programmed.

17. The memory device according to claim 11, wherein the memory device is further configured to increase the level of the pass voltage in response to a number of program pulses applied to the one of the plural non-volatile memory cells during the data program operation, and
wherein the setup time becomes shorter as a temperature of the memory device is higher.

18. The memory device according to claim 17, wherein the memory device changes the level of the pass voltage when the program mode is the second mode, and
wherein the control device determines the setup time corresponding to each of the first mode, the second mode, and the third mode.

19. The memory device according to claim 11, wherein the setup time becomes shorter as a number of program pulses applied to the at least one non-volatile memory cell during the data program operation is greater.

20. A method for operating a memory device, comprising:
applying a first program pulse through a word line to program multi-bit data to plural non-volatile memory cells;
verifying program states of the plural non-volatile memory cells, which correspond to the first program pulse;
determining a program mode, which causes a change of threshold voltages of the plural non-volatile memory cells, for a second program pulse to be applied to the word line; and
increasing a level of a pass voltage, which is applied to other non-volatile memory cells coupled to the plural non-volatile memory cells, from a first level to a second level, which is higher than the first level, before controlling a potential of a bit line according to the program mode while the second program pulse is applied to the word line, or adjusting a setup time for changing a potential of a bit line coupled to the at least one non-volatile memory cell, according to the program mode.

* * * * *